United States Patent [19]

Takashima et al.

[11] Patent Number: 5,555,519

[45] Date of Patent: *Sep. 10, 1996

[54] DYNAMIC RANDOM ACCESS MEMORY DEVICE WITH THE COMBINED OPEN/FOLDED BIT-LINE PAIR ARRANGEMENT

[75] Inventors: Daisaburo Takashima, Kawasaki; Shigeyoshi Watanabe, Yokohama, both of Japan

[73] Assignee: Kabushiki Kaisha Toshiba, Kawasaki, Japan

[*] Notice: The term of this patent shall not extend beyond the expiration date of Pat. No. 5,396,450.

[21] Appl. No.: 348,068

[22] Filed: Nov. 23, 1994

Related U.S. Application Data

[63] Continuation of Ser. No. 123,466, Sep. 20, 1993, Pat. No. 5,396,450.

[30] Foreign Application Priority Data

Sep. 22, 1992 [JP] Japan .................................. 4-253270
Sep. 14, 1993 [JP] Japan .................................. 5-229215

[51] Int. Cl.[6] .................................................. G11C 13/00
[52] U.S. Cl. .............................. 365/63; 365/51; 365/149; 257/296
[58] Field of Search ............................. 365/51, 63, 149, 365/189.02, 168

[56] References Cited

U.S. PATENT DOCUMENTS

| | | | |
|---|---|---|---|
| 4,319,342 | 3/1982 | Scheuerlein | 257/313 |
| 4,872,142 | 10/1989 | Hannai | 365/189.07 |
| 4,970,564 | 11/1990 | Kimura et al. | 257/306 |
| 5,107,459 | 4/1992 | Chu et al. | 365/63 |
| 5,243,558 | 9/1993 | Saeki | 365/182 |
| 5,276,641 | 1/1994 | Sprogis et al. | 365/189.02 |
| 5,432,735 | 7/1995 | Parks et al. | 365/168 |

FOREIGN PATENT DOCUMENTS

| | | |
|---|---|---|
| 4-271086 | 9/1992 | Japan . |
| 5-54635 | 3/1993 | Japan . |
| 5-235298 | 9/1993 | Japan . |

*Primary Examiner*—Robert P. Limanek
*Attorney, Agent, or Firm*—Oblon, Spivak, McClelland, Maier & Neustadt, P.C.

[57] ABSTRACT

A dynamic random access memory device includes a semiconductor substrate, a plurality of parallel word lines on the substrate, and a plurality of pairs of bit lines transverse to the word lines on the substrate. An array of one-transistor memory cells are selectively arranged at the cross points as defined between the word lines and the bit lines. The array is subdivided into a plurality of subarray sections. A sense amplifier section is connected to the bit lines. The sense amplifier section includes first and second sense amplifier circuits. Adjacent bit-line pairs of the bit lines include a first bit-line pair and a second bit-line pair, one of which has a folded bit-line arrangement being included in a certain subarray section to be connected to the first sense amplifier circuit, and the other of which has an open bit-line arrangement that extends into the subarray section and another subarray section adjacent thereto, and is connected to the second sense amplifier circuit.

34 Claims, 11 Drawing Sheets

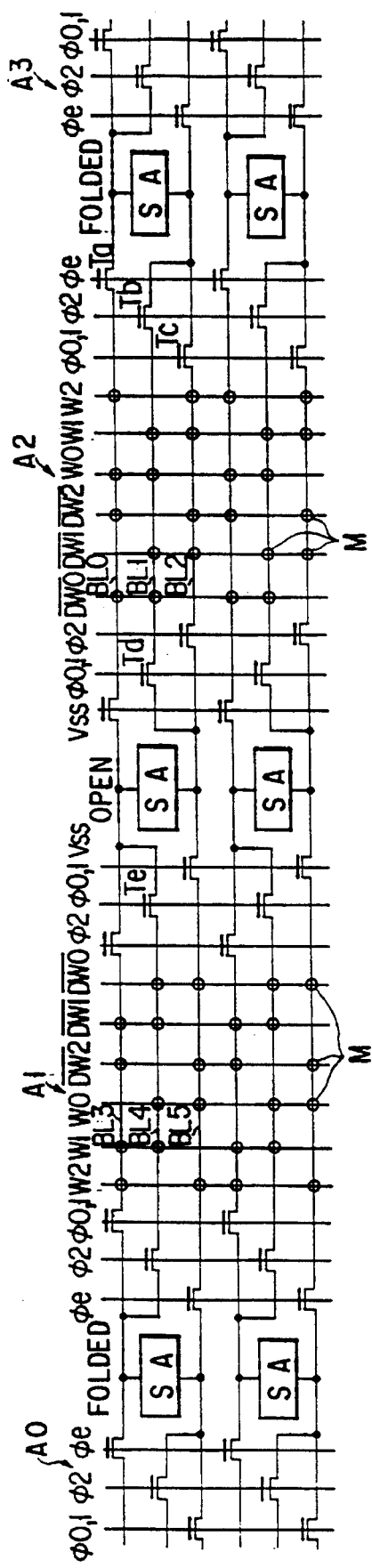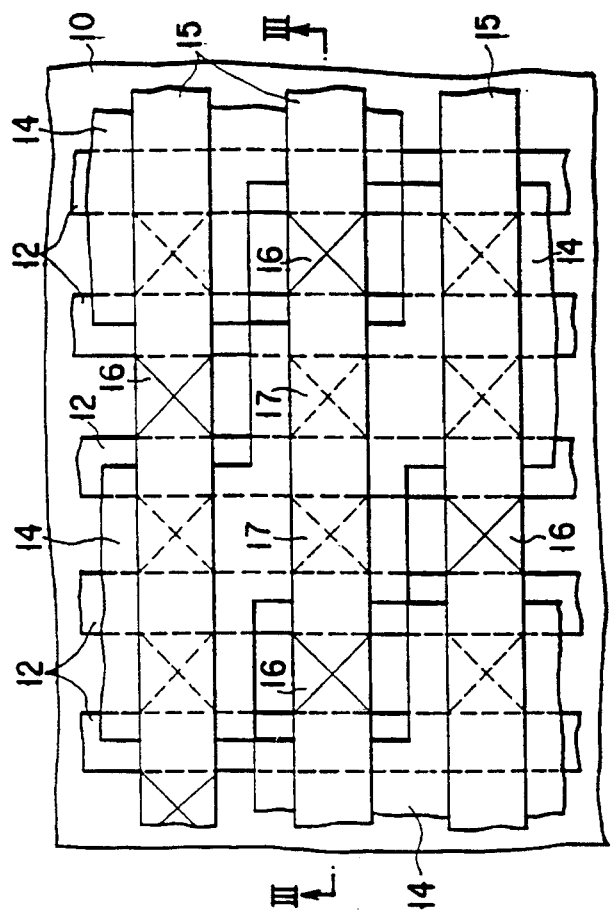
FIG. 1
FIG. 2

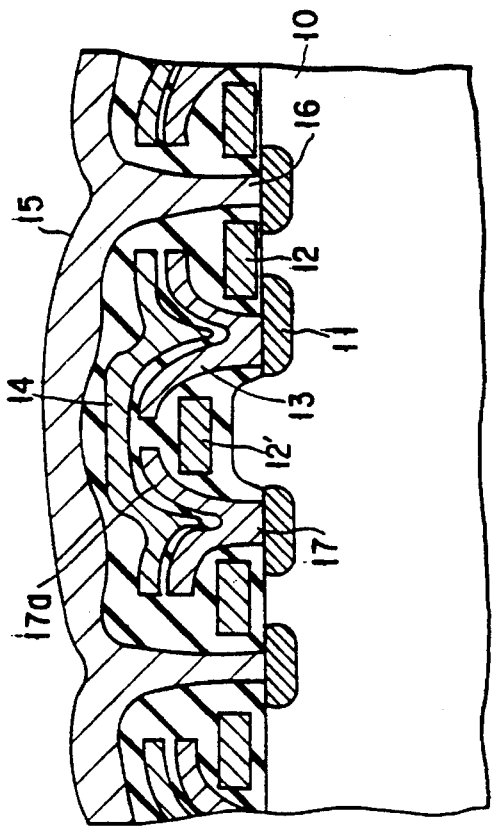
F I G. 3
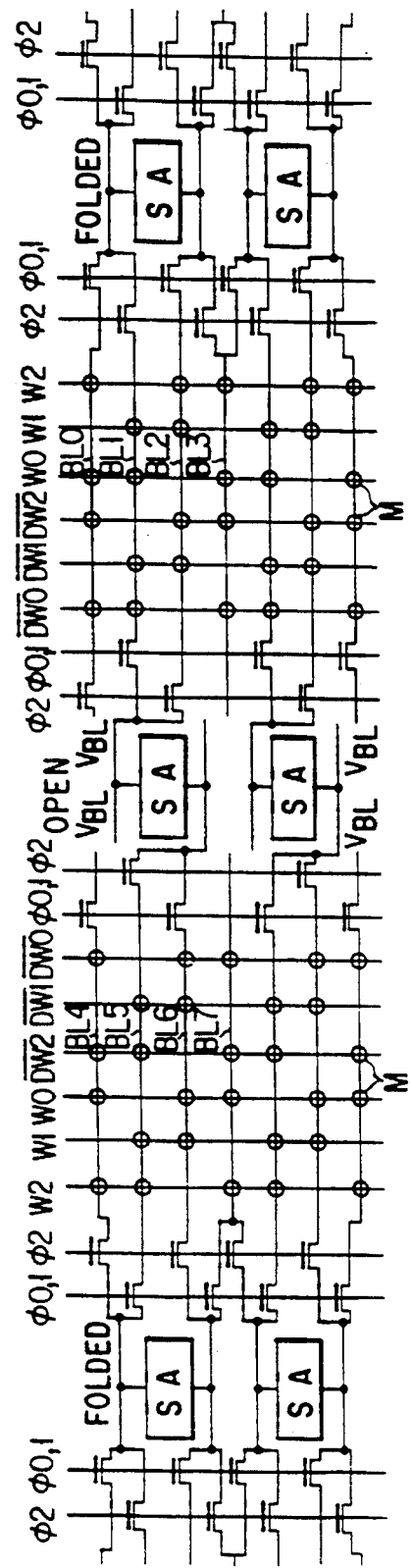
F I G. 4

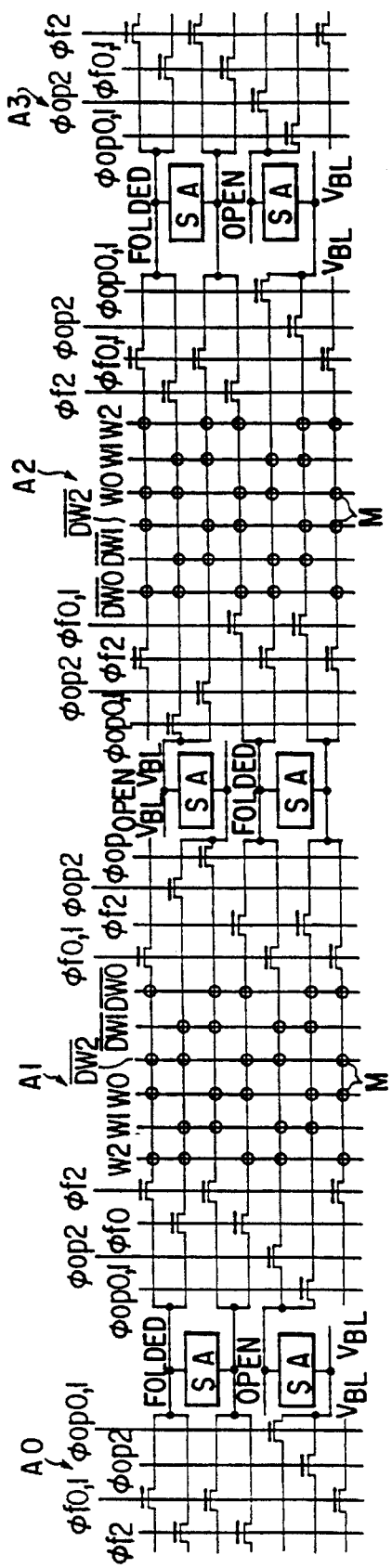
F I G. 5
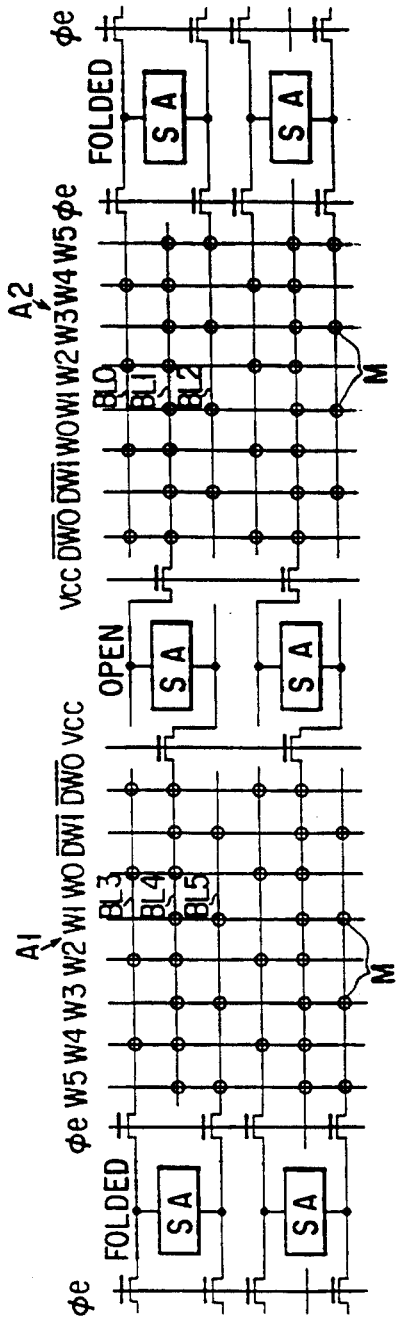
F I G. 6

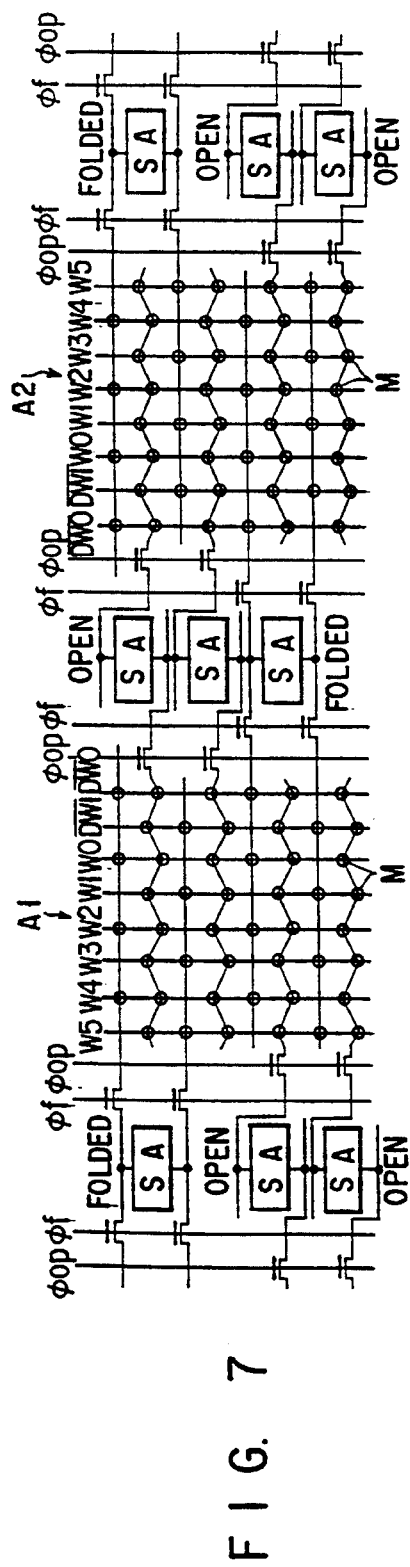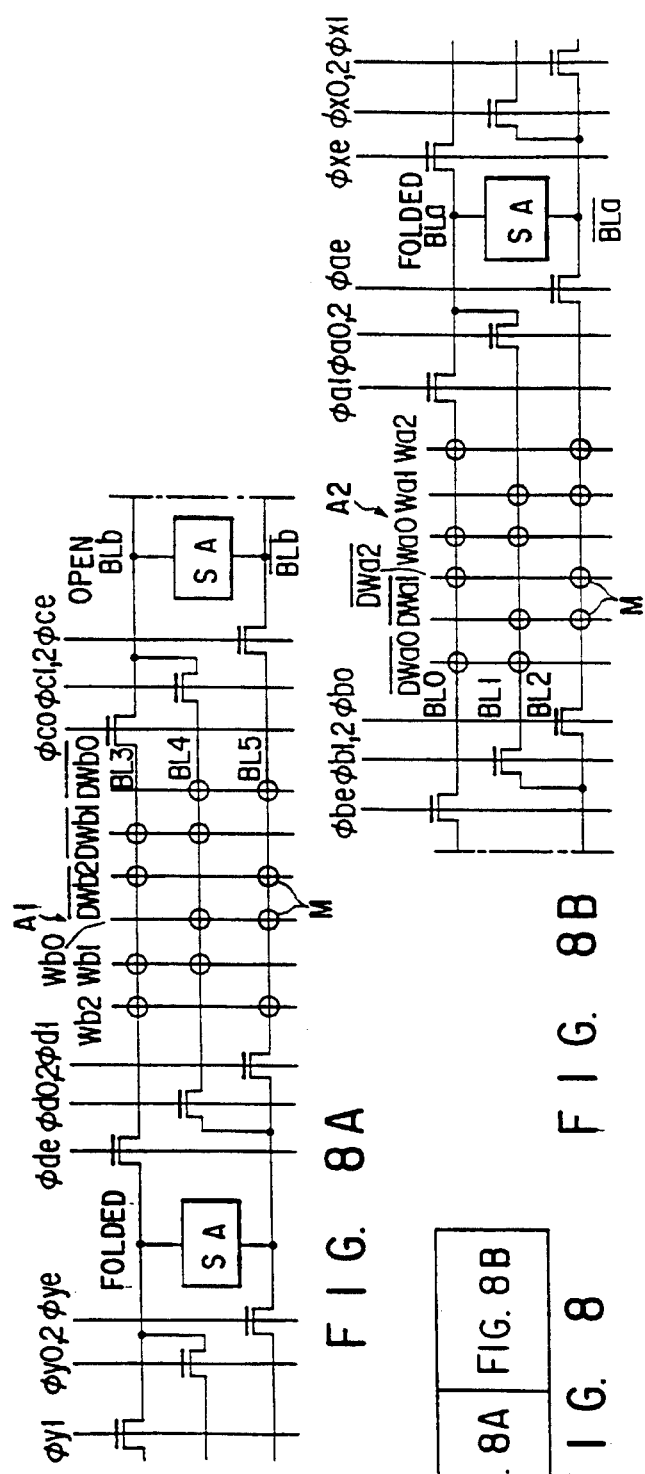
FIG. 7
FIG. 8A
FIG. 8B
| FIG. 8A | FIG. 8B |
FIG. 8

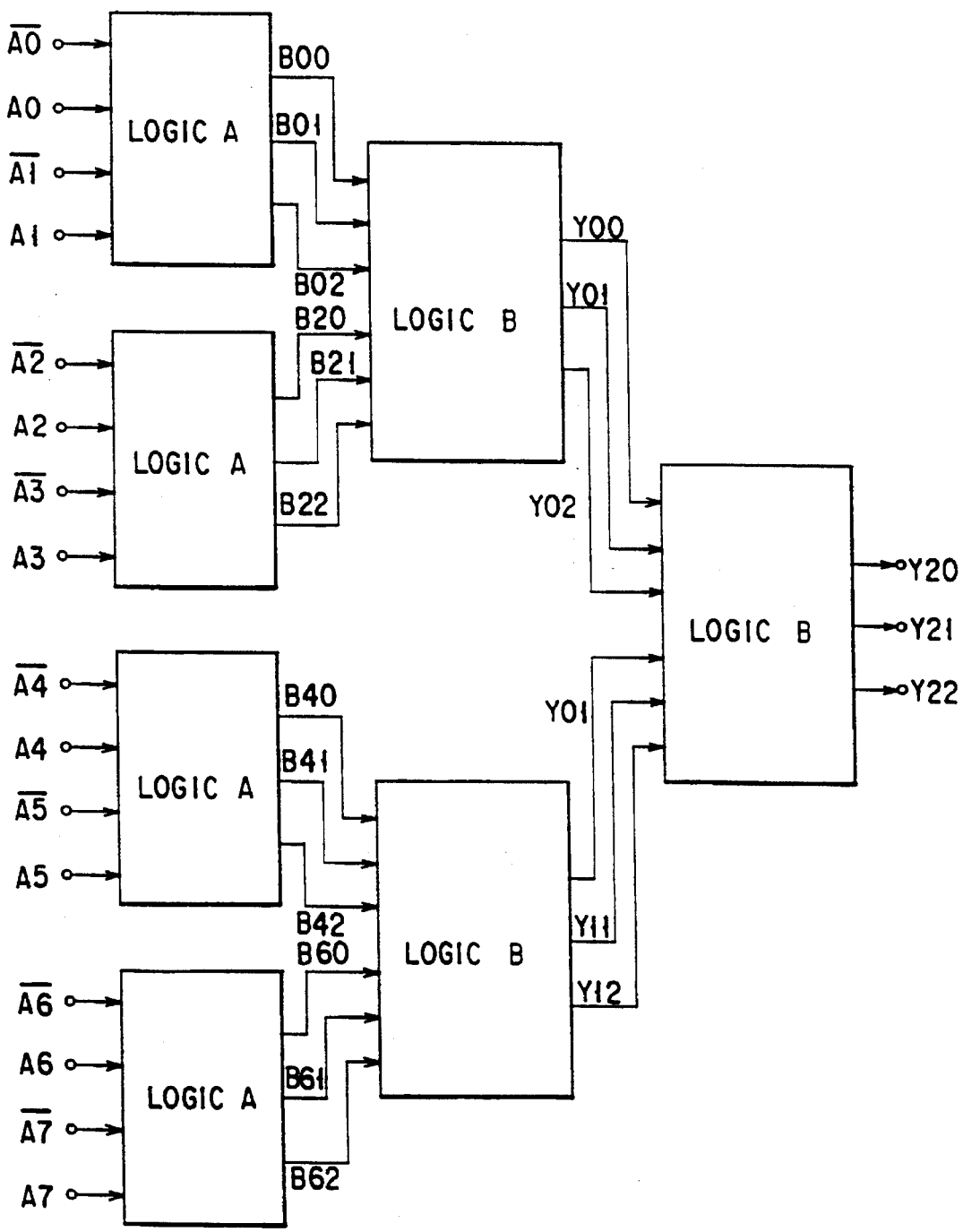
F I G. 10

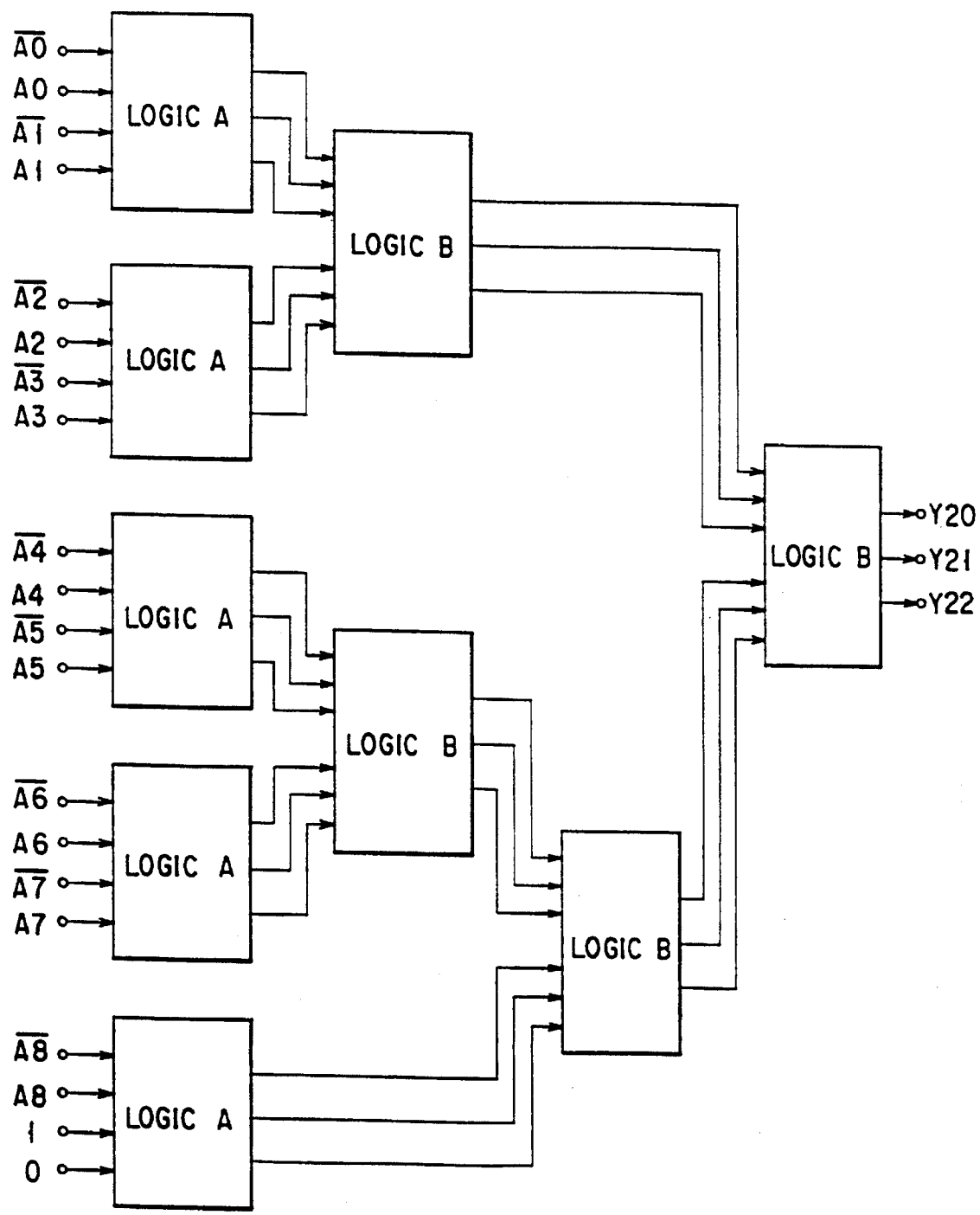
F I G. 15

DYNAMIC RANDOM ACCESS MEMORY DEVICE WITH THE COMBINED OPEN/FOLDED BIT-LINE PAIR ARRANGEMENT

This is a continuation of application Ser. No. 08/123,466, filed Sept. 20, 1993, now U.S. Pat. No. 5,396,450.

BACKGROUND OF THE INVENTION

1. Field of the Invention

The present invention relates in general to semiconductor memory devices and in more particular to dynamic random-access memory (DRAM) devices of the type employing an array of one-transistor memory cells. The invention also relates to an improved sense amplifier circuitry for a MOS memory device.

2. Description of the Related Art

Recently, MOS dynamic random access memory (DRAM) devices are becoming more widely used in the manufacture of digital equipment, particularly small-size computers, as the speed and cost advantages of these devices increase. As semiconductor technology is advanced, the devices are increasing in integration density due to remarkable improvements in the memory cell structure and in the micro-fabrication techniques. As memory devices require higher packing density (integration density), higher speed, and lower dissipation, the sense amplifiers become critical.

Some prior DRAM devices employ what is called the "open bit-line" system that exhibits high integration density by allowing the area of memory cells to decrease on a chip substrate of limited size, while others use the "folded bit-line" system which accomplishes a reduced sense-amplifier area and enhanced noise-withstanding characteristics. A conflicting problem may exist in the two types of bit-line systems: While the open bit-line system is advantageous in the achievement of higher integration density of the memory cells, it suffers from the difficulty in designing sense-amplifier circuits to meet a strict circuit-design rule, which may result in that the positioning or distributing of the sense amplifiers is difficult in a limited surface area of the substrate. In contrast, with the folded bit-line system, while the circuit design rule may become moderate to make it easier to design the sense amplifiers associated therewith, the integration density of memory cells decreases due to an increase in the required area of memory cells on the substrate.

Conventionally, with the open bit-line system, memory cells are allowed to be arranged at all the cross points as defined between the bit lines and the word lines; therefore, the resultant integration density of memory cells may be maximized, causing the memory-cell array section to decrease in occupation area on a chip substrate. On the other hand, in the open bit-line system, since two bit lines constituting each bit-line pair extend to run into two neighboring memory-cell subarrays, it is strictly required that a sense amplifier circuit associated therewith is packed within a reduced substrate-surface area, which may correspond in length to the bit-line width. Such a sense-amplifier layout requirement makes it difficult to arrange a number of sense amplifier circuits on the chip substrate as a whole.

Recently, to soften the layout difficulty, what is called the "relaxed open bit-line" system has been proposed, wherein sense amplifier circuits are alternately positioned on the both sides of a memory-cell subarray. However, even such a bit-line system will not able to meet sufficiently the demands for further improvement in the integration density of DRAMs in the near future. Since a sense amplifier circuit should be required with respect to every group of two bit lines, the design rule for the sense amplifiers still remains strict as a whole.

In contrast, the folded bit-line system, which has been the major system for long in the DRAM technology since the past 64K-bit DRAM generation until today, uses bit-line pairs each consisting of two bit lines "folded" at their certain nodes on one side thereof, whereat a corresponding sense amplifier circuit is electrically connected to the bit-line pair. Parallel word lines extend in a direction transverse to the two folded bit lines. Memory cells are arranged only at specifically selected ones of the cross points between the word lines and the bit lines, wherein the specific cross points are half the overall cross points in number. More specifically, looking at a single word line, only one of the two cross points as defined between this word line and the two folded bit lines is provided with a memory cell; any memory cell is prevented from being arranged at the other of the two cross points. Looking at two neighboring word lines, the layout of memory cells may exhibit a "zig-zag" pattern. To attain such an arrangement, two sense amplifier circuits for two adjacent folded bit-line pairs are alternately located on the two opposite sides of a corresponding memory-cell subarray. This results in that, in a viewpoint of sense-amplifier circuit design, one sense amplifier may be provided with respect to four adjacent bit lines on one side of the subarray. This means that the positioning distance between sense amplifier circuits along the word-line direction can be allowed to increase substantially up to the width of four bit lines. It is thus possible to make easier the layout of a number of sense amplifier circuits on the chip substrate.

Unfortunately, with the presently available folded bit-line system, it cannot be permitted in principle that memory cells are arranged or distributed among all the cross points defined between the word lines and the bit lines, as has been described previously. This may cause the memory-cell array section to increase in area on the substrate surface as a whole. Such an increase in the area of the memory-cell array section will become a serious bar to the achievement of a further improved integration density in DRAMs. In particular, when the semiconductor technology is rushed into the age of extra-highly integrated DRAMs of the next generation (such as 256M-bit DRAMs or more), which will strictly require a further reduction in the cell-array area, it may be obvious that the folded bit-line system can no longer go with the trend of further improvements in the integration density. This can also be said due to the fact that the reduction in the area of each memory cell has approached almost the limit of inherence in the presently available DRAM devices.

SUMMARY OF THE INVENTION it is therefore an object of the present invention to provide a new and improved semiconductor memory device which can attain high integration density.

It is another object of the invention is to provide a new and improved dynamic random access memory device which can exhibit higher packing density of an array of memory cells, while allowing the design rule for sense amplifiers to be moderate or flexible on a chip substrate of limited size.

In accordance with the above objects, the present invention is drawn to a specific dynamic type semiconductor memory device, which includes a semiconductor substrate, a plurality of word lines on the substrate, and a plurality of pairs of bit lines transverse to the word lines on the substrate. An array of memory cells are selectively arranged at the cross points as defined between the word lines and the bit lines. A sense amplifier section is connected to the bit lines. The sense amplifier section includes first and second sense amplifier circuits. Adjacent bit-line pairs of the bit lines include a first bit-line pair and a second bit-line pair, one of which has a folded bit-line arrangement to be connected to the first sense amplifier circuit, and the other of which has an open bit-line arrangement being connected to the second sense amplifier circuit.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 1 is a diagram showing the overall arrangement of a memory-cell array of a dynamic random access memory (DRAM) device in accordance with one preferred embodiment of the invention.

FIG. 2, is a partial plan view of the main part of the DRAM of FIG. 1.

FIG. 3 is a cross sectional view of the DRAM along line III—III of FIG. 2.

FIGS. 4 to 8 (FIG. 8 is comprised of FIGS. 8A and 8B) illustrate the memory-cell array sections of DRAM devices in accordance with other embodiments of the invention.

FIG. 10 is a diagram showing a binary to ternary conversion logic circuit which is preferably used in the DRAM devices of the invention.

FIG. 15 is a diagram showing a modification of the circuit of the binary to ternary conversion logic circuit shown in FIG. 14.

FIG. 7 is a diagram showing a logic circuit in accordance with another embodiment of the invention, which circuit provides a reminder to be generated when an input binary number is divided by the number three, by the input of a four-digit binary number.

DETAILED DESCRIPTION OF THE PREFERRED EMBODIMENTS

Figure 9:
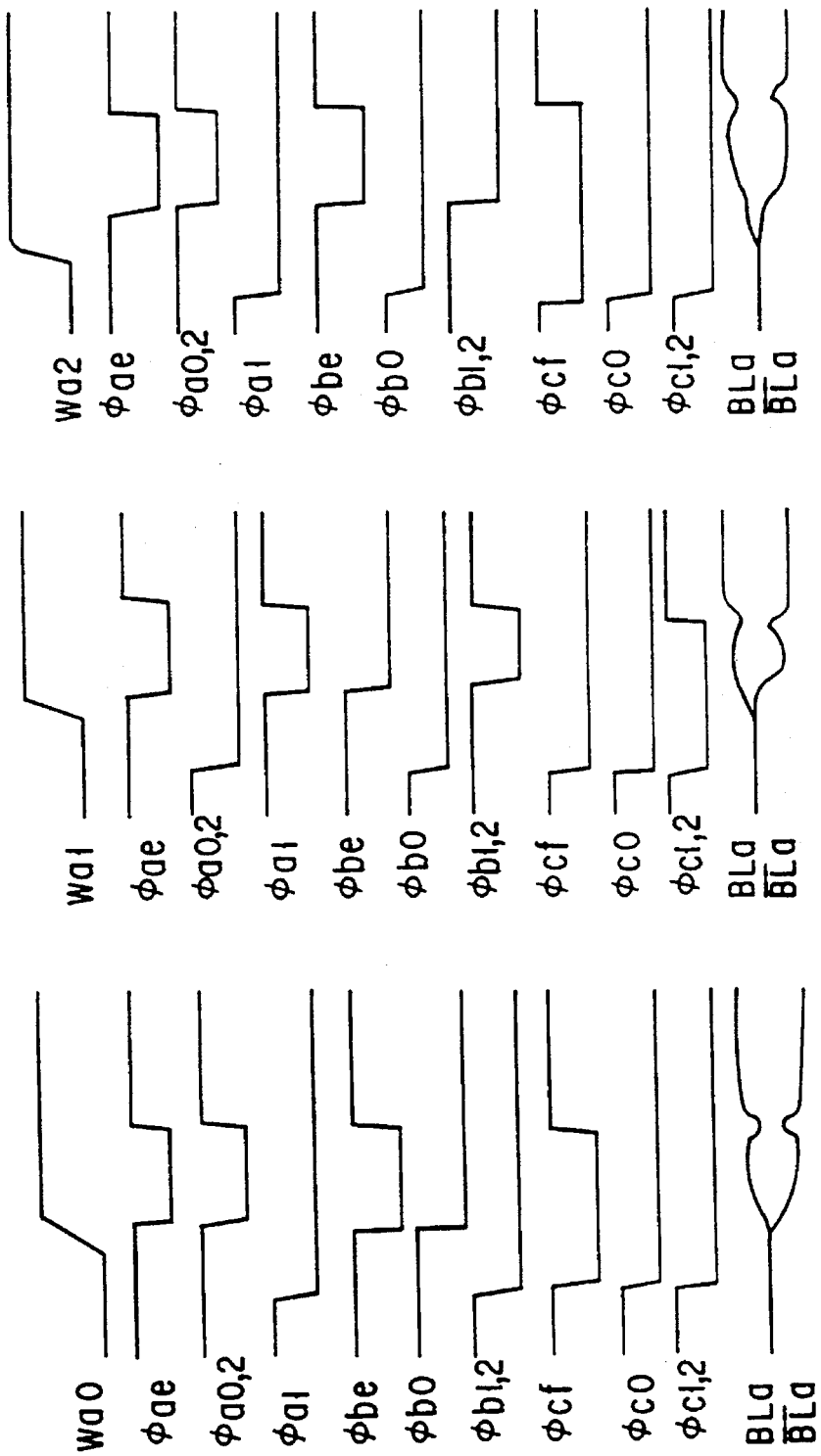
FIGS. 9A–9C are graphic representations of voltages appearing at various points in the memory systems of FIG. 8, plotted as a function of time, wherein FIGS. 9A–9C correspond to the selection of three word lines in a memory-cell subarray, respectively.

A dynamic random access memory (DRAM) device in accordance with one preferred embodiment of the invention is shown in FIG. 1, which illustrates a memory cell array section of it. As shown in FIG. 1, the cell array section is subdivided into a plurality of sections called "memory-cell subarrays" A0, A1, A2, A3, . . . ; two adjacent ones of which are mainly illustrated as subarrays of memory cells A1, A2 for purposes of explanation only. Each of these subarrays A1, A2 include a plurality of parallel word lines W0, W1, W2, and a plurality of dummy word lines $\overline{DW0}$, $\overline{DW1}$, $\overline{DW2}$. The word lines extend in a first direction on a chip substrate 10 (shown in FIG. 2), which is made from semi-conductor material such as silicon of a selected conductivity type.

The cell subarrays A1, A2 include a number of parallel bit lines BL0, BL1, BL2, BL3, BL4, BL5, . . . , each of which is provided at its both ends with MOS transistors including transistors Ta, Tb, Tc, Td, Te arranged as shown in FIG. 1. The transistors Ta–Te have gates to which control clock signals $\phi 0,1$, $\phi 2$ and $\phi E$ are supplied to control the switching operations of them. The bit lines BL extend in a second direction transverse to the first direction on the substrate 10, so that the word lines W, $\overline{DW}$ and bit lines BL define cross-points therebetween. Bit lines BL are specifically arranged to provide a plurality of bit-line pairs as will be described in detail later. In each subarray A1, A2, a selected number of so-called one-transistor memory cells M are selectively arranged at certain ones of the cross points between word lines W, $\overline{DW}$ and bit line BL.

In each subarray A1, A2, a "unit" bit-line pair structure is defined with every group of three adjacent bit lines being as a unit. In subarray A1, first three bit lines BL3–BL5 are arranged so that the first and third bit lines BL3, BL5 constitute a pair of the "folded" bit-line arrangement, known as a "folded bit-line pair." The second bit line BL4 is connected in parallel with first bit line BL3 at its opposite nodes. Regarding the first three bit lines BL0–BL2 in subarray A2, the first and third bit lines BL0, BL2 form a pair of the folded bit-line structure, while the second bit line BL1 is coupled to third bit line BL2 at the opposite nodes thereof, as shown in FIG. 1. The following bit-line group each consisting of three neighboring bit lines in each subarray A1, A2 may be similar in configuration to the above-described bit-line arrangement.

As shown in FIG. 1, a sense amplifier circuit SA is provided in an area as defined between the subarrays A1, A2 in such a manner that the sense amplifier has two nodes, one of which is connected to a common node of bit lines BL0, BL3 which extend straight in the second direction, and the other of which is coupled to a common node of bit lines BL2, BL5 also extending in the second direction. A next sense amplifier circuit arranged in the area between subarrays A1, A2 is associated with corresponding two of the following three bit lines in each of subarrays A1, A2 in a similar manner as described above. The above sense-amplifier arrangement may be called a "shared" sense-amplifier system for the "open" bit-line pairs: The sense amplifier senses and amplifies the difference of a potential appearing between a pair of open bit lines extending between subarrays A1, A2.

In the right-end area of the subarray A2, a sense amplifier circuit SA is provided so that it is connected to the bit lines BL0, BL2 forming a folded bit-line pair. This sense amplifier is also connected to two corresponding bit lines included in another memory-cell subarray (A3), which neighbors subarray A2 and is partially illustrated for purposes of illustration only. Such a shared sense amplifier at the right side of subarray A2 may function as a folded bit-line sense amplifier. Similarly, at the left end of the subarray A1, a sense amplifier circuit is arranged so as to be coupled to the bit lines BL3, BL5 constituting a folded bit-line pair. The same sense amplifier is also connected to two corresponding bit lines in a memory-cell subarray (A0), which lies near to subarray A1. The sense amplifier on the left side of subarray A1 has a shared sense amplifier configuration for the folded bit-line system. The sense amplifiers SA and the switching MOS transistors constitute a sense amplifier section of the DRAM.

The positioning of the memory cells M among selected cross-points between the word lines W, $\overline{DW}$ and bit lines BL is as follows. Memory cells M are arranged at ⅔ of all the word/bit cross points in each subarray A1, A2. More specifically, with respect to subarray A1, 5he three bit lines BL3–BL5 and three word lines W0–W2 define nine cross-points therebetween, only six cross-points of which are provided with memory cells M as shown in FIG. 1. Similarly, while the same bit lines BL3–BL5 and three dummy word lines $\overline{DW0}$–$\overline{DW2}$ define nine cross points, only six points of them are provided with memory cells. The same applies to the subarray A2.

The ratio of the number of memory cells versus the total number of word/bit cross-points (say, the "cell distribution" ratio) is ⅔, which is greater than "½" which is to be obtained in the case of the conventional DRAMs of the full-folded bit-line type, while it is obviously less than "1" (to be obtained in the case of the prior-art DRAMs of full-open bit-line type). This indicates that each of the memory-cell subarray sections A1, A2 can be decreased in occupation area on the substrate surface as compared with the full-folded bit-line type DRAMs, while causing the sense-amplifier layout design rule to be softened or moderated by allowing a sense-amplifier mount area on substrate 10 (that is, a substrate-surface area used to mount the sense amplifiers associated with subarrays A1, A2) to increase. It is thus possible to overcome successfully the major conflicting problems that have been raised in the full-folded bit-line type DRAMs and in the full-open bit-line type DRAMs.

An explanation will now be given of the distance (or pitch) between adjacent sense amplifiers SA arranged on each side of memory-cell subarray A1, A2. With the embodiment, as shown in FIG. 1, only one sense amplifier SA is provided for the three adjacent bit lines BL0–BL2 (or BL3–BL5). Another way saying this is that each sense amplifier is allowed to occupy, on the substrate surface, an increased surface area that may correspond in length to the width of these three bit lines BL. While such a sense-amplifier area is narrower than that of a full-folded bit-line type DRAMs (which allows a sense amplifier to occupy the area corresponding to the width of four adjacent bit lines), it can be greater than that of the presently available relaxed-open bit-line type DRAMs, which requires that each sense amplifier should be packed within a narrow substrate-surface area corresponding to the width of two adjacent bit lines.

The operation of the embodiment is as follows. Assume that a word line W0 is selected from among the word lines associated with the memory-cell subarray A2. In this case, only the memory cells which are arranged at the cross points between the selected word line W0 and two bit lines BL0 and BL1 of the bit lines BL0–BL2 are subjected to a read operation, permitting cell-data bits to be read out of the memory cells onto the bit lines BL0, BL1. At this time, only the clock signals $\phi 0,1$ and $\phi E$ of several control clock signals $\phi 0,1$, $\phi 2$ and $\phi E$ being applied to the cell subarray A2 are at a high or "H" level potential; the clock signal $\phi 2$ is forced to remain at a low at "L" level potential. The same is true with respect to the cell subarray A1: The clock signals $\phi 0,1$ and $\phi E$ are at the "H" level, while the clock signal $\phi 2$ is at the "L" level.

Under such a condition, the first and third bit lines BL0, BL2 of the three "unit" bit lines BL0–BL2 constitute or exhibit a folded bit-line pair configuration. The clock signals $\phi E$, $\phi 0,1$ are supplied to the gates of switching transistors (MOSFETs) Ta, Tc, causing these transistors to turn on. This enables the sense amplifier SA connected with the folded bit-line pair BL0, BL2 to sense and amplify the difference between data potentials appearing on these bit lines BL0, BL2. At this time, the bit line BL2 serves as a reference bit line for defining a reference data potential.

The cell-data bit read onto the bit line BL1 is sensed and amplified by a corresponding one of the "open bit-line" sense amplifiers being arranged between the memory-cell subarrays A1, A2 in such a manner as follows: Assume the control clock signal $\phi 0,1$ being supplied to the subarray A2 on the left side thereof and the clock signal $\phi 0,1$ supplied to the subarray A1 on the right side thereof go high at "H" level, causing the switching transistors (MOSFETs) Td, Te to turn on. This enables the bit line BL1 in subarray A2 to be electrically connected to the bit line BL4 included in the neighboring subarray A1 through the sense amplifier SA between subarrays A1, A2, thereby to form an open bit-line pair with the bit line BL4 being as a reference bit line.

In a case where another word line W1 is selected alternatively in the cell subarray A2, a similar read operation is carried out under a condition that the clock signals $\phi e$ and $\phi 0,1$ are at "H" level while the clock signal $\phi 2$ is at "L" level. When a still another word line W2 is selected, cell-data bits are read onto the bit lines BL0, BL2. When the clock signals $\phi 2$, $\phi E$ are at "H" level, the clock signal $\phi 0,1$ goes down at the "L" level. This permits the bit lines BL0, BL1 to constitute a folded bit-line pair arrangement. The sense amplifier arranged on the right side of subarray A2 (between subarrays A2, A3) senses and amplifies the difference between data potentials appearing on these bit lines BL0, BL1. The bit line BL2 forms an open bit-line pair together with the bit line BL3 of subarray A1; the potential difference therebetween is sensed and amplified by a "open bit-line" sense amplifier arranged between subarrays A1, A2.

As is apparent from the above explanation, the forming position of the folded bit-line pair and that of the open bit-line pair are changed in accordance with the position of a presently selected word line. In other words, the three "unit" bit lines BL0–BL2 (BL3–BL5) in each memory-cell subarray A1, A2 change their bit-line connecting configuration to selectively exhibit either the folded bit-line pair or the open bit-line pair in response to the selection of a word line among the word lines. This enables the DRAM device to overcome the technical problems that take place in the conventional full-folded bit-line type DRAMs and the problems in the conventional full-open bit-line type DRAMs and the relaxed-open bit-line type DRAMs, simultaneously.

According to the embodiment as described above, by the combination of an open bit-line system (wherein the memory cells are same in number as the cross points as defined between the bit lines and the word lines) and a folded bit-line system (wherein the number of memory cells is as small as half the number of the cross points between the bit lines and the word lines), it becomes possible to increase the number of memory cells which may be arranged among the cross points between the word lines and bit lines so that the cell number is greater than that of the folded bit-line system, although the number remains less than that of the open bit-line system. Therefore, the cell area can be reduced as compared with the conventional folded bit-line type DRAMs. Furthermore, the layout pitch of the sense amplifier circuits SA along the direction of bit lines (that the distance between adjacent sense amplifiers) can be decreased in length as compared with the open bit-line system, which limits the number of allocable sense amplifiers to "1" for two adjacent bit lines in maximum. The decrease in sense-amplifier pitch may cause the sense-amplifier layout design rule to become relaxed or softened as compared with the open bit-line system, although the resulting design rule remains still more severe than that in the folded bit-line system (which allows each sense amplifier to be mounted in an increased substrate-surface area corresponding to the width of four adjacent bit lines).

Conventionally, the relaxed-open bit-line system, which requires one sense amplifier to be mounted in the substrate-surface area corresponding to the width of two adjacent bit lines, suffers from an increase in the number of memory-cell subarrays on the substrate, as compared with the full-open bit-line system (which forces one sense amplifier to be arranged in a narrow surface area corresponding to the width of a single bit line so that the sense-amplifier layout pitch is extremely small and strict with the on-chip circuit designers). With the DRAM device embodying the invention, by contrast, the sense-amplifier layout pitch can become greater than that of the relaxed-open bit-line system, without causing the number of cell subarrays to increase undesirably. As a result, with the embodiment, it becomes possible to overcome the major technical problems raised in the conventional open bit-line system and those of the folded bit-line system, while allowing the major advantages that come from each of the open bit-line system and the folded bit-line system to maintain in the embodiment.

Note in the embodiment that what is called the "reverse-phase" control scheme may be applied to the H/L-level controlling of the dummy word lines $\overline{DW0}$–$\overline{DW2}$, $\overline{DW3}$–$\overline{DW5}$. More specifically, concerning the dummy word lines $\overline{DW0}$–$\overline{DW2}$ in the memory-cell subarray A2, when W0 is selected and is at the "H" level, the dummy word line $\overline{DW0}$ is potentially changed at "L" level; when the word line W1 is at "H" level, the dummy word line $\overline{DW1}$ is dropped down at "L" level; when the word line W2 is at the "H" level, the dummy word line $\overline{DW2}$ is at "L" level. When the invention is reduced to practice, these dummy word lines may alternatively be modified to operate under a "forward-phase" control scheme; if required, the dummy word lines may be omitted.

FIG. 2 illustrates the plan view of a part of the memory cells for use in the DRAM device embodying the invention. The cross sectional view of it along line III—III is shown in FIG. 3. In FIG. 3, the semiconductor substrate is designated by the numeral 10. Semiconductor impurity-diffusion layers !i are formed in the surface of substrate 10 so that they are spaced apart at a predetermined distance. A plurality of parallel elongate conductive layers 12, 12' are arranged to extend above the substrate 10. These layers act as the word lines WL. The layer 12' is a pass-through word line. A layer 13 having a "Y"-shaped profile is a storage-node. This storage-node layer 13 has two opposite end portions, which partially overlie the word-line layers 12, 12' as shown in FIG. 3. A plate electrode 14 insulatively overlies the storage-node layer 13. An elongate conductive layer 15 is positioned at the top level in FIG. 3, and is arranged to extend in the direction transverse to the word lines 12, 12'. The bit-line layer 15 is electrically contacted with the substrate 10 by way of a contact section 16. Another contact section 17 is provided as a storage-node contact section. The storage-node contact layer 17 has one end portion which partially covers the underlying pass-through word line 12' thereby to function as a part of a data-storage capacitor.

In the memory cells associated with ordinary folded bit-line pairs, four word lines (12) run in a space between two adjacent bit-line contact sections, one of which may correspond to the bit-line contact section 16 of FIG. 3 and another bit-line contact section being connected to a neighboring bit line. In contrast, with the embodiment, the number of such word lines between adjacent bit-line contact sections 16 is decreased down to "three." This memory cell is the cell called the "stack type" memory cell, wherein the bit line 15 is formed after the formation of the plate electrode 14. Another memory-cell structure may be employed alternatively. In either case, the memory-cell area can be decreased as the number of word lines decreases as described above. The storage-node layer 13 may be modified in shape to have a different profile. A memory cell structure, wherein a plate electrode is formed after the formation of a bit line, may be applied to the memory cell. A "trench" type memory cell structure may also to applied which has a narrow, deep groove called a "trench" in the substrate.

A memory cell array of a DRAM shown in FIG. 4 is similar in structure and operation to that of FIG. 1 with the forming positions of the folded bit-line pair and the open bit-line pair is different as will be described below.

In the embodiment of FIG. 4, assume that the word line W0, W1 is selected in the memory-cell subarray A2. In this case, the clock signal $\phi 0,1$ is at the "H" level while the clock signal $\phi 2$ is at "L" level. This enables the bit lines BL0, BL2 of subarray A2 to form a folded bit-line pair, and also enables the bit line BL1 of subarray A2 to form an open bit-line pair together with the bit line BL6 belonging to the neighboring subarray A1. When the word line W2 is selected, the clock signal $\phi 2$ goes high toward "H" level, while the clock signal $\phi 0,1$ is at the "L" level. This results in that the bit lines BL1, BL3 form a folded bit-line pair in subarray A2; the bit line BL2 of subarray A2 forms an open bit-line pair together with the bit line BL5 in the neighboring subarray A1.

With the embodiment of FIG. 4, the bit-line position is shifted by one with respect to the word lines W0, W1 and word line W2, thus causing one of the bit lines constituting the open bit-line pair to be put between two bit lines presently forming a folded bit-line pair in any event. This means that the folded bit-line pair as presently formed "surrounds" one of the bit lines forming the open bit-line pair on the both sides of it; the folded bit lines may be electrically shielded from each other by the "inserted" bit line. It is thus possible to suppress or eliminate the occurrence of an internal noise-interference in the folded bit-line pair.

Furthermore, the open bit-line pair can also be improved or enhanced in a noise-reduction effect: Looking at the open bit-line pair, this bit-line pair has each bit line being surrounded by two bit lines forming the folded bit-line pair on the both sides thereof. These folded bit lines are reverse to each other in the "H"/"L" level setting: When one of them is at "H" level, the other is at "L" level; if the one is at "L" level, the other is at "H" level. A noise of the positive polarity δ (+) may occur on a bit line being set at the "H" level due to the sense-amplifying operation of a corresponding sense amplifier circuit; a noise of the negative polarity δ (−) may take place on a bit line being set at the "L" level. These facts indicate that the noises, which are amplified by the sense amplifier to appear on the folded bit lines surrounding the open bit line, become different in polarity from each other. Such noises δ (+), δ (−) can be easily canceled out when applied onto the open bit line. Therefore, the embodiment can attain a reduced noise-generation successfully, in addition to the above-described advantages of the first embodiment as explained previously.

A memory cell array in accordance with another embodiment of the invention is shown in FIG. 5. The main feature of this cell array is that the "open" sense-amplifier circuits and the "folded" sense-amplifier circuits are alternately positioned in any one of the substrate-surface areas as defined between adjacent ones of the memory-cell subarrays A0–A3. Another way saying of this is that the embodiment of FIG. 5 differs from the FIG. 4 embodiment in the layout of open/folded sense amplifiers as follows: while the FIG. 4 embodiment locates only the open sense amplifiers in the area between subarrays A1, A2 and positions only the folded sense amplifiers on the right side of subarray A2 and the left side of subarray A1, the embodiment of FIG. 5 is similar to that of FIG. 4 with the layout positions of sense amplifiers SA being rearranged so that the sense amplifiers for different types of bit line pairs (that is, the open bit-line pairs and the folded bit-line pairs) are disposed alternately in each of the sense-amplifier layout areas as defined between adjacent ones of the subarrays A0–A3 on the substrate.

With such an arrangement, it becomes possible to decrease in number the switching transistors being arranged between the bit lines and the control clock signal transmission lines φ0,1 and φ2 to the extent that only one transistor is necessary for one bit line. Remember that, in the FIG. 4 embodiment, the series array of folded sense-amplifiers on the right side of subarray A2 (or on the left side of subarray A1) require that five transistors should be arranged in the section whereat bit lines BL0–BL3 intersect the clock signal transmission lines φ0,1 and φ2.

Additionally, with the embodiment of FIG. 5, the clock signals φ0,1 and φ2 as employed in FIG. 4 are subdivided into a first group of clock signals φf0,1 and φf2 (the letter "f" stands for "folded") and a second group of clock signals φo0,1 and φo2 (the letter "o" means "open") in order to cause the sense-amplifying operations of the alternately positioned folded/open sense amplifiers to be separated from each other. The technical advantages derived from the embodiment may be similar to those in the prior embodiments.

A memory cell array also embodying the invention is shown in FIG. 6. The main difference of this embodiment from the above embodiments is that the forming positions of the folded bit-line pair and the open bit-line pair are fixed irrespective of the position of a word line as presently selected. In the memory-cell subarray A2, the first and third bit lines BL0, BL2 of three "unit" bit lines BL0–BL2 are arranged to constantly form a folded bit-line pair, which is connected at its right-side nodes to a "folded" sense amplifier circuit. The second bit line BL1 of the three bit lines is arranged to always constitute an open bit-line pair together with a corresponding one of bit lines BL3–BL5 belonging to the neighboring subarray A1, which bit-line pair is connected to one of the sense amplifier circuits arranged between subarrays A1, A2.

Even such an arrangement can achieve the reduction of memory-cell area and the increase or "relaxation" of sense-amplifier layout pitch. Simultaneously, the occurrence of a bit-line noise can be minimized due to the fact that any one of an open pair of bit lines is put between two bit lines constituting a corresponding folded bit-line pair associated therewith.

Another difference of the embodiment of FIG. 6 from the prior embodiments is as follows: memory cells are present at all the cross points defined between any one of the two bit lines (BL1, BL4) forming the open bit-line pair and the word lines W0–W5, $\overline{DW0-DW1}$ as shown. These memory cells are arranged linearly on each open bit line BL1, BL4 without having any "empty" word/bit cross points. Concerning the folded bit-line pair BL0, BL2 (or BL3, BL5), half-numbered memory cells are arranged alternately in the line of word/bit cross points along each folded bit line BL0, BL2: Four cells are arranged at eight cross points in each bit line of the folded bit-line pair. Even with such a cell layout, the memory-cell area can be decreased as compared with the conventional folded bit-line system.

Another memory cell system also embodying the invention is shown in FIG. 7. The significant feature of this embodiment is that the "cell distribution" ratio (i.e., the ratio of the number of memory cells versus the total number of word/bit cross-points) is increased as a whole as compared with the embodiments described previously. To do this, an increased number (three) of sense amplifier circuits SA should be required with respect to eight bit lines as provided in each cell-subarray A1, A2. Any one of the bit lines which belong to an open bit-line pair is arranged to extend in a zig-zag manner between adjacent folded bit-line pairs. It is apparent from viewing the illustration of FIG. 7 that the zig-zag line-shape is reversed between adjacent open bit lines so that a hexangular pattern appears at the cross-point area defined between the adjacent open bit lines and three adjacent word lines (W0–W2 in subarray A2, for example). The arrangement can remain more excellent than the presently available relaxed-open bit-line pairs in the relaxation of sense-amplifier layout pitch on the substrate.

FIG. 8, comprised of FIGS. 8A and 8B, shows a memory cell array section of a DRAM device in accordance with another embodiment of the invention, which is assumed to include two subarrays A1, A2, for purposes of explanation only. The memory-cell subarrays A1, A2 includes word lines Wa0–Wa2, Wb0–Wb2 and dummy word lines $\overline{DWa0-DWa2}$, $\overline{DWb0-DWb2}$, which extend in parallel with one another. Word lines Wa0–Wa2 and dummy word lines $\overline{DWa0-DWa2}$ intersect parallel bit lines BL0–BL2 in subarray A2; word lines Wb0–Wb2 and dummy word lines $\overline{DWD0-DWb2}$ intersect parallel bit lines BL3–BL5 in the subarray A1. Memory cells M are arranged selectively at the cross points defined between the bit lines BL0–BL5 and word lines Wa0–Wa2, Wb0–Wb2; memory cells are also arranged at selected ones of the cross points defined between the bit lines BL0–BL5 and dummy word lines $\overline{DWa0-DWa2}$, $\overline{DWb0-DWb2}$ as shown in FIG. 8.

In subarray A2, the bit line BL1 has a first node (the right-side node) connected to the bit line BL0, and a second node (the left-side node) connected to the bit line BL2. In subarray A1, the bit line BL4 has a first node (the right-side node) connected to the bit line BL3, and a second node (the left-side node) connected to the bit line BL5. A sense amplifier SA is provided between subarrays A1, A2 so that it has a first node connected to through switching transistors (MOSFETs) the bit lines BL0, BL3–BL4, and a second node connected to the bit lines connected through MOSFETs to bit lines BL1–BL2 and BL5. The MOSFETs are arranged in bit lines BL0–BL5 respectively as shown in FIG. 8. These MOSFETs have gate electrodes coupled to control clock signals φb0, φb1,2, φbe, φce, φco and φc1,2.

The bit lines BL0–BL2 are provided at their right-side nodes with three MOSFETs, which have gate electrodes coupled to control clock signals φa1, φa0,2 and φae. Another three MOSFETs are arranged on the left-side nodes of bit lines BL3–BL5 in subarray A1; the gates of them are coupled to control clock signals φde, φd0,2 and φd1. Sense amplifiers SA are arranged on the right side of subarray A2 and on the left side of subarray A1 as shown in FIG. 8. Control clock signals φx0,2, φx1, φxe, φy0,2, φy1 and φye are supplied to the gates of MOSFETs, which are connected to further neighboring bit lines (not visible in FIG. 8).

The sense amplifiers SA on the right side of subarray A2 and the shared sense amplifier SA on the left side of subarray A1 are the sense amplifier circuitry that operate in the folded bit-line system. During a read operation, when one is selected from the word lines Wa0–Wa2 in subarray A2, two of the three "unit" bit lines BL0–BL2 has memory cells at the cross points between them and the selected word line. At this time, the MOSFETs responsive to the clock signals φb0, φb1,2 and φbe perform a switching operation, causing one of the two "cell-present" bit lines to form a folded bit-line pair with the remaining "cell-absent" bit line of the three "unit" bit lines BL0–BL2 (as a reference-side bit line), which pair is electrically connected to the first and second nodes of the sense amplifier between subarrays A1, A2. Under such a condition, this sense amplifier may act as a folded bit-line sense amplifier.

During a rewrite operation, the MOSFETs responsive to the clock signals φb0, φb1,2, φbe perform a different switching operation, causing the reference-side bit line of the folded bit-line pair to cut off from the sense amplifier between the subarrays A1, A2, and simultaneously causing the other (i.e., "cell-present" bit line) of the same folded bit-line pair to form an open bit-line pair together with a corresponding one of the three "unit" bit lines BL3–BL5 in the neighboring subarray A1. At this time, the sense amplifier SA between subarrays A1, A2 may serve as an open bit-line sense amplifier.

with such an arrangement, the folded bit-line pair and the open bit-line pair are alternately formed with respect to a presently selected word line in either one of the subarrays A1, A2 in the read and rewrite periods. More specifically, during the read period, two folded bit-line pairs are formed in the subarray A2 including a selected word line with the "cell-absent" bit line being as a common reference bit line for the two folded bit-line pairs: one of these folded bit-line pairs in subarray A2 is connected to the sense amplifier between subarrays A1, A2, the other of the pairs is connected at the opposite end to the sense amplifier arranged on the right side of subarray A2. During the rewrite period, one of the folded pair of bit lines is rearranged or "disassembled" so that it alternatively forms an open bit-line pair together with one of the bit lines BL3–BL5 belonging to the neighboring subarray A1. In a case where a word line is selected in the subarray A1, the same goes with it.

with such an "alternate folded/open bit-line changeover" control scheme, it becomes possible to eliminate the occurrence of noise inherent to the open bit-line pair, which noise may come by way of the selected word line during the read operation. This may be equivalent to the noise-cancellation effect (that is, canceling out noises coming Through non-selected word lines) as attained in the folded bit-line system. The noise-reduction can be improved throughout the read and rewrite operations.

Furthermore, since the data rewrite is carried out under the open bit-line system, the data-restoring and bit-line equalizing operations can be performed by employing an ordinary restoring technique and an ordinary bit-line equalizing technique.

Regarding the "cell distribution" ratio in this embodiment, it is the same as that in the first embodiment as shown in FIG. 1: the ratio of the number of memory cells versus the total number of word/bit cross-points is ⅔, which is greater than "½" which is to be obtained in the case of the conventional DRAMs of the full-folded bit-line type, while it is obviously less than "1" (which is obtained in the case of the prior-art DRAMs of full-open bit-line type).

Regarding the sense-amplifier layout pitch, each sense amplifier circuit is allowed to be mounted in an increased substrate-surface area that corresponds to the width of three adjacent bit lines (BL0–BL2). Such a three-to-one sense-amplifier distribution feature can relax the circuit design rule on the chip substrate of limited size.

Accordingly, the embodiment of FIG. 8 can solve the three major problems in the prior art DRAM devices: the "increased cell-size" problem in the conventional folded bit-line system, the "decreased sense-amplifier layout-pitch" problem that causes the conventional open bit-line type DRAMs to suffer from the difficulty of sense-amplifier circuit design rule, and the noise problem in the conventional open bit-line system.

The operation of the FIG. 8 embodiment will now be explained with reference to the timing diagrams of FIGS. 9A–9C, which represent three different cases in accordance with the selection of three word lines Wa0–Wa2 in the cell subarray A2.

Firstly, let's consider the case where the word line Wa0 is selected in the subarray A2. In this case, two "cell-present" bit lines BL0, BL1 of the three "unit" bit lines BL0–BL2 are subjected to a read operation while the remaining, "cell-absent" bit line BL2 acts as a reference bit line. Data-bits are then read onto bit lines BL0, BL1. At this time, the control clock signals φa1, φb1,2 are at the "L" level, whereas the clock signals φae, φa0,2, φb0 are at the "H" level, causing the corresponding MOSFETs to turn on. This enables the bit lines BL0, BL2 to form a folded bit-line pair (the bit line BL2 is a reference data line), which pair is connected at its left-end nodes to the sense amplifier arranged between subarrays A1, A2. The above clock-signal supply also enables the bit lines BL1, BL2 to form another folded bit-line pair (the bit line BL2 is a reference data line), which is connected at its right-end nodes to the sense amplifier arranged on the right side of subarray A2.

After the elapse of a predetermined time during which the data bits are sufficiently read out onto the bit lines BL0, BL1, the clock signals φae, φa0,2, φbe and φb0 are potentially dropped down at the "L" level, causing all the bit lines BL0–BL2 to be disconnected from the sense amplifiers SA associated therewith. The sense amplifiers SA are then activated to become operative. The difference in potential between the bit lines BL0, BL2 of the folded bit-line pair (as designated by BLb, $\overline{BLb}$ in FIG. 8A) is sensed and amplified by the sense amplifier SA arranged between subarrays A1, A2; the potential difference between the bit lines BL1, BL2 of the other folded bit-line pair (as designated by BLa, $\overline{BLa}$ in FIG. 8B) is sensed and amplified by the sense amplifier SA arranged on the right side of subarray A2.

Thereafter, the DRAM rushes into a rewrite (restore) mode, in which the read data bits are rewritten or restored into the corresponding memory cells. At this time, the control clock signals φae, φa0,2 become at the "H" level again. This permits that the bit lines BL1, BL2 form the folded bit-line pair BLa, $\overline{BLa}$ again, which is connected to the sense amplifier arranged on the right side of subarray A2. The read data held in this sense amplifier is supplied to the once-read memory cell at the cross points between the selected word line Wa0 and the bit line BL1, and is then rewritten into it. Subsequently, the word line Wa0 is forced to drop down in potential. The bit-line equalizing operation is performed by sorting the bit lines BL1, BL2.

During the rewrite period, the read-data rewrite operation for the other folded bit-line pair BLb, $\overline{BLb}$ cannot be performed similarly to the read-data rewrite operation made in the folded bit-line pair BLa, $\overline{BLa}$. This is due to the fact that the bit line BL2 is "busy" in working as the "reference data line" for the folded bit-line pair BLa, $\overline{BLa}$. To cure such an inconvenience, the embodiment is specifically arranged so that the read-data rewrite operation for the other folded bit-line pair BLb, $\overline{BLb}$ is carried out by forcing the bit line BL0 to form an open bit line pair together with a selected one of the three bit lines BL3–BL5 in the neighboring subarray A1, that is, the bit line BL5. To do this, the control clock signals φbe, φce go high, causing the corresponding MOSFETs to turn on. This enables the bit line BL0 of subarray A2 and the bit line BL5 of subarray A1 to constitute an open bit-line pair, which incorporates the sense amplifier arranged between subarrays A1, A2. The read data maintained in this sense amplifier is then restored in such a manner that the data of bit line BLb is supplied back to the bit line BL0, and the data of bit line $\overline{BLb}$ is fed to the bit line BL5, thus causing the data to be rewritten into the memory cell at the cross point between the selected word line Wa0 and the bit line BL0. Thereafter, the word line Wa0 potentially drops down; the bit-line equalizing operation is performed by sorting the bit lines BL0, BL5.

As is apparent from the above explanation, by suitably controlling the associated switching MOSFETs using the clock signals φa1, φa0,2, φae, φb0, φb,12 φbe, the twin folded bit-line pairs are formed, during the read period, in such a manner that these folded bit-line pairs use the bit line BL2 as a common reference data line. During the following rewrite period, the twin folded bit-line pairs are "reformed" into folded/open combined bit-line pairs in such a manner that, while the bit lines BL1, BL2 are allowed to continuously form the folded bit-line pair (BLa, $\overline{BLa}$) incorporating the sense amplifier arranged on the right side of subarray A2, the bit line BL0 is forced to form a new open bit-line pair (BLb, $\overline{BLb}$) together with the bit line BL5 in the neighboring subarray A1. This means that the read operation is performed under the full folded bit-line system, and the rewrite or restore operation is carried out under the combination of folded/open bit-line pairs. Therefore, it is possible to achieve successful rewrite and equalize functions, while suppressing the occurrence of noises during the read period to the extent that the resultant noise is as small as in the folded bit-line system.

The timing diagrams shown in FIGS. 9B and 9C indicate respectively the case where a word line Wa1 is selected and the case where a word line Wa2 is selected. These timing diagrams are similar to that of FIG. 9A with the position of a memory cell in subject being different from that in the case of selecting the word line Wa0; due to such cell-position difference, the position of the "folded-to-open changing" bit line (that is, the bit line BL0 in the selection of word line Wa0 as described above) is shifted among the bit lines BL0–BL5 accordingly.

According to the DRAMs embodying the invention, by suitably combining the open bit-line system and the folded bit-line system in the memory cell array section of each DRAM, the memory cell area can be reduced as compared with the full-folded bit-line system, while having the sense-amplifier circuit design rule relaxed or softened in comparison with the full open bit-line system. This means that the conflicting major requirements can be accomplished simultaneously in one DRAM device.

when the inventive concept of employing suitably combined open/folded bit-line pairs in a DRAM device is reduced to practice, a three-phase clock signal controller circuitry may be required in order to effectively perform a dummy-cell selection and to control the changeover among the sense amplifiers and the bit lines. This means that any presently available simple binary-number processing/controlling techniques may not be utilized to the embodiments of the invention as described previously; in other words, the well-known binary-based clock-signal control scheme can no longer be used to control the memory cell array embodying the invention. To control it, a specific logic system may be employed which logically converts an input binary number into a corresponding ternary number; a specific 1-bit data corresponding to the most significant digit of such ternary number is used as several control signals for the embodiment devices. The rest of the description will be devoted to the presentation of binary-to-ternary conversion logic circuitry that are preferably adapted to incorporate the embodiments.

In the art of semiconductor devices, any logic circuit has neither been proposed nor developed until today, which circuit performs a binary-to-ternary conversion in such a manner that, when a binary number is input thereto, it divides the binary number by 3 to produce a reminder in the ternary-number format. To achieve such logic circuit, the following considerations are necessary. For example, assume that a binary number of n digits (where n is an integer) is input. A reminder that is obtained by dividing the n-digit binary number by 3 may be represented in the ternary-number format; however, since 2 and 3 is the prime number, an output cannot be determined as far as the signal data sets of all the digits (n). Imagine a four-digit binary number "A3 A2 A1 A0" is input, which corresponds to the decimal number 2. Representing a ternary number {0, 1, 2} by "X0 X1 X2", where one of these Xs becomes 1 at any event, the binary-to-ternary conversion logic is as follows.

TABLE 1

| Binary Number | | | | Ternary Number | | | | Output | | |
|---|---|---|---|---|---|---|---|---|---|---|
| A3 | A2 | A1 | A0 | | | | | X2 | X1 | X0 |
| 0 | 0 | 0 | 0 | 0 | 0 | 0 | 0 | 0 | 0 | 1 |
| 0 | 0 | 0 | 1 | 0 | 0 | 0 | 1 | 0 | 1 | 0 |
| 0 | 0 | 1 | 0 | 0 | 0 | 0 | 2 | 1 | 0 | 0 |
| 0 | 0 | 1 | 1 | 0 | 0 | 1 | 0 | 0 | 0 | 1 |
| 0 | 1 | 0 | 0 | 0 | 0 | 1 | 1 | 0 | 1 | 0 |
| 0 | 1 | 0 | 1 | 0 | 0 | 1 | 2 | 1 | 0 | 0 |
| 0 | 1 | 1 | 0 | 0 | 0 | 2 | 0 | 0 | 0 | 1 |
| 0 | 1 | 1 | 1 | 0 | 0 | 2 | 1 | 0 | 1 | 0 |
| 1 | 0 | 0 | 0 | 0 | 0 | 2 | 2 | 1 | 0 | 0 |
| 1 | 0 | 0 | 1 | 0 | 1 | 0 | 0 | 0 | 0 | 1 |
| 1 | 0 | 1 | 0 | 0 | 1 | 0 | 1 | 0 | 1 | 0 |
| 1 | 0 | 1 | 1 | 0 | 1 | 0 | 2 | 1 | 0 | 0 |
| 1 | 1 | 0 | 0 | 0 | 1 | 1 | 0 | 0 | 0 | 1 |
| 1 | 1 | 0 | 1 | 0 | 1 | 1 | 1 | 0 | 1 | 0 |
| 1 | 1 | 1 | 0 | 0 | 1 | 1 | 2 | 1 | 0 | 0 |
| 1 | 1 | 1 | 1 | 0 | 1 | 2 | 0 | 0 | 0 | 1 |

As an example, a logic equation wherein X0=1 (that is, a reminder of a quotient obtained by being divided by 3 is 0) is as follows:

$$X0 = (\overline{A3}\,\overline{A2}\,\overline{A1}\,\overline{A0}) + (\overline{A3}\,\overline{A2}\,A1\,A0) + \qquad (1)$$
$$(\overline{A3}\,A2\,A1\,\overline{A0}) + (A3\,\overline{A2}\,\overline{A1}\,A0) +$$
$$(A3\,A2\,\overline{A1}\,\overline{A0}) + (A3\,A2\,A1\,A0),$$

where, Ai (i=0, 1, 2, 3)={0, 1}.

A corresponding logic circuitry to attain the Formula 1 will be a large-scaled logic circuit, which is very complicated in configuration as it requires an increased number (typically six) of four-input NAND gates having outputs coupled to inputs of a secondary NAND gate having an output whereat an output X0 is generated. A similar large-scaled NAND logic configuration should be required with respect to each of the remaining digits X1, X2 of the ternary number. If the input binary number increases in digit, a resultant logic circuitry will become further complex, thus causing the achievement of it to become difficult on the chip substrate of a limited size as used in highly integrated DRAM devices. Obviously, such a binary-to-ternary conversion logic circuit has not been required at all among the presently existing semiconductor memory devices.

The embodiments shown in FIGS. 1, 4–5 and 8 are different. These embodiments require such a binary-to-ternary conversion logic circuit. These embodiments further require that the logic circuit is simplified in configuration to attain a miniaturized logic circuitry. Assume that the memory cell array of any one of FIGS. 1, 4–5, 8 incorporates an increased number of word lines W0, W1, W2, . . . , W256. It may occur that, when the suffix "i" of a given word line Wi (i=0, 1, 2, . . . , 256) is divided by 3, the reminder is 0 or 1; if this is the case, it should be required that the control clock signal $\phi 0,1$ of FIG. 1 (as an example) is at the "H" level. Alternatively, when the reminder is 2, the clock signal $\phi 2$ should be required to be at the "H" level. The conventional logic circuits cannot be used to accomplish the above logic function, because the conventional circuit is 8 bits at the inputs thereof (as 256=2⁸), which is too complicated and too large in scale to be used as the logic circuit for producing the reminder in the division by 3.

A binary-to-ternary conversion logic circuit shown in FIG. 10 can overcome the above problems and can thus be preferably applied to any one of the embodiment DRAMs of FIGS. 1–9. The significance of the logic circuit of FIG. 10 is as follows: when a binary number of a plurality of digits (bits) is input, the binary bits are subdivided into sections each having two bits. The bit subdivision is made sequentially from the least significant bit toward the most significant bit of the input binary number. Each of the "bit sections" is supplied to a logic unit (say, logic A), which divides it by 3 to generate at its output a reminder in the ternary number format. The outputs ternary number is fed to another logic unit (logic B), in which the ternary-number outputs of logic A units are added together in the ternary number format. The least significant bit of a resulting ternary number is then output from the final-stage logic B unit.

More specifically, the logic circuit of FIG. 10 includes a plurality of logic A units in the first stage. Four logic A units are provided under an assumption that the logic circuit deals with a 8-bit (8-digit) binary number "A7 A6 A5 A4 A3 A2 A1 A0" input thereto. Each of the logic A units is arranged to receive an input data corresponding to a 2-digit binary-component of the 8-digit binary number, and to divide the 2-digit data by 3 so that a remainder is produced at the output thereof. The remainder is represented in the ternary number format.

For example, the first logic A unit divides the 2-digit binary number "A1 A0" by 3 to output a ternary number B0 (="B02 B01 B00") as a remainder. The second logic A unit divides another 2-digit binary number "A3 A2" by 3 to generate a ternary number B2 (="B22 B21 B20") as a remainder. Similarly, the third logic A unit divides a still another 2-digit binary number "A5 A4" by 3 to produce a ternary number B4 (="B42 B41 B40") as a remainder. The fourth logic A unit divides the last 2-digit binary number "A7 A6" by 3 to output a ternary number B6 (="B62 B61 B60") as a remainder.

The ternary-number outputs B0, B2 of the first and second logic A units are supplied to a logic B unit, which adds them together to provide a first sum in the ternary number format. The ternary-number outputs B4, B6 of the third and fourth logic A units are fed to another logic B unit, which adds them together to generate a second sum in the ternary number format. These first and second sums are further supplied to the last-stage logic B unit. This logic unit adds them together to provide the grand total of B0+B2+B4+B6, only the least significant digit of which is then sent forth from the output as the least significant bit Y2 (="Y22 Y21 Y20") as shown in FIG 10.

As a result of such logic operations, the output data Y2 of the final-stage logic B unit is equivalent to the remainder that is produced when the input 8-digit binary-number is divided by 3. This can be true on the basis of the following analysis. The input binary number "A7 A6 A5 A4 A3 A2 A1 A0" is converted into a corresponding decimal number, which is then subdivided into four sections each consisting of two digits or bits. This may be described quite well by the equation as follows:

$$A7\ A6\ A5\ A4\ A3\ A2\ A1\ A0\ \text{(binary)} \qquad (2)$$
$$= A7 \cdot 2^7 + A6 \cdot 2^6 + A5 \cdot 2^5 + A4 \cdot 2^4 + A3 \cdot 2^3 +$$
$$A2 \cdot 2^2 + A1 \cdot 2^1 + A0 \cdot 2^0 \text{ (decimal)}$$
$$= (A7 \cdot 2 + A6) \cdot 2^6 + (A5 \cdot 2 + A4) \cdot 2^4 +$$
$$(A3 \cdot 2 + A2) \cdot 2^2 + (A1 \cdot 2 + A0) \cdot 2^0 \text{ (decimal)}.$$

By converting the binary-number value of each section, we obtain:

$$A7\ A6\ A5\ A4\ A3\ A2\ A1\ A0\ \text{(binary)} \qquad (3)$$
$$= (B7 \cdot 3 + B6) \cdot 4^3 + (B5 \cdot 3 + B4) \cdot 4^2 +$$
$$(B3 \cdot 3 + B2) \cdot 4^1 + (B1 \cdot 3 + B0) \cdot 4^0.$$

The relation in the binary-to-ternary conversion in each 2-bit section is as follows:

$$\begin{cases} A7 \cdot 2 + A6 &= B7 \cdot 3 + B6, \\ A5 \cdot 2 + A4 &= B5 \cdot 3 + B4, \\ A3 \cdot 2 + A2 &= B3 \cdot 3 + B2, \\ A1 \cdot 2 + A0 &= B1 \cdot 3 + B0, \end{cases} \qquad (4)$$

where Bi (i=0, 1, 2)={0, 1, 2}.

Therefore, the binary number may be represented by:

$$A7\ A6\ A5\ A4\ A3\ A2\ A1\ A0\ \text{(binary)} \qquad (5)$$
$$= (B7 \cdot 3 + B6)(3+1)^3 + (B5 \cdot 3 + B4)(3+1)^2 +$$
$$(B3 \cdot 3 + B2)(3+1)^1 + (B1 \cdot 3 + B0)(3+1)^0.$$

Obviously, $$(3+1)^n = 3^n + {}_nC_{n-1}3^n + \ldots + {}_nC_1 3^n + 1 \qquad (6)$$
$$= 3K+1,$$

where K is an integer. The relation of Formula 6 is modified by:

$$(3+1)^n = 3K' + (B6+B4+B2+B0). \qquad (7)$$

It is apparent from Formula 7 that the remainder to be occurred when the input binary number is divided by 3 is equal to the least significant bit of the second term of Formula 7. Finally, the reminder generated when the 8-digit binary number "A7 A6 A5 A4 A3 A2 A1 A0" is divided by 3 is same in value as a reminder to be generated when the ternary-number sum B6+B4+B2+B0 is divided by 3.

In Formula 4, the relation of A1+A0=B1.3+B0 is represented by Table 2 that follows.

TABLE 2

| A1 | A2 | B1 | B2 | B02 | B01 | B00 |
|----|----|----|----|-----|-----|-----|
| 0  | 0  | 0  | 0  | 0   | 0   | 1   |
| 0  | 1  | 0  | 1  | 0   | 1   | 0   |
| 1  | 0  | 0  | 2  | 1   | 0   | 0   |
| 1  | 1  | 1  | 0  | 0   | 0   | 1   |

The bits B00, B01, B02 are represented by:

$$\begin{cases} B00 = \overline{(A1\ \overline{A0})} + \overline{(A1\ A0)} = \overline{\overline{(A1\ \overline{A0})} \cdot \overline{(A1\ A0)}}, \\ B01 = \overline{A1}\ A0 = \overline{A1 + \overline{A0}}, \\ B02 = A1\ \overline{A0} = \overline{\overline{A1} + A0}. \end{cases} \quad (8)$$

Figure 11:
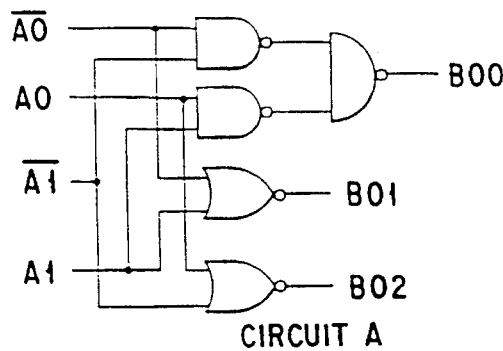
FIG. 11 shows one of a plurality of first internal logic units employed in the circuit of FIG. 10.

Therefore, the logic relations as defined in Formula 4 may be accomplished by a logic circuitry shown in FIG. 11, which corresponds to the logic A unit of FIG. 10. This is the logic circuit that determines the least significant digit (bit) to be generated when an input binary number is converted into a ternary number.

Figure 13:
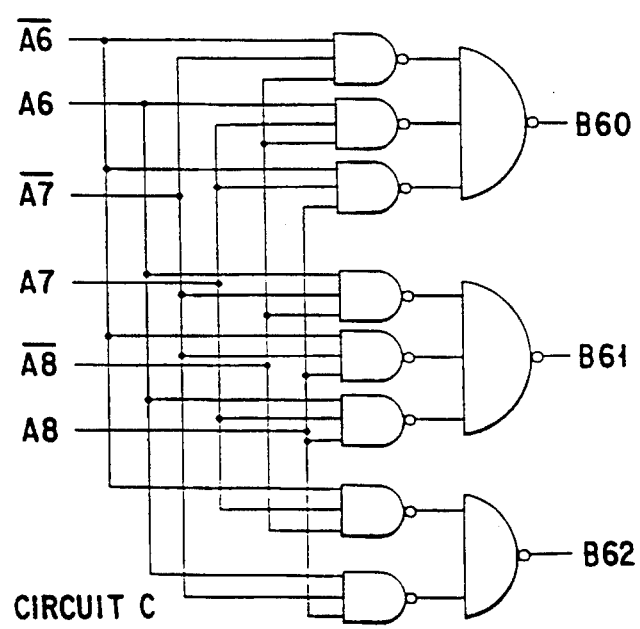
FIG. 13 is a diagram showing a third internal logic circuit unit which is arranged to process the upper three digits of an input binary number, when the binary number has an even number of digits.

The logic function of generating the least significant digit (bit) of the ternary-number remainder "B6+B4+B2+B0" as defined in Formula 7 is accomplished by the three logic B units of FIG. 10, wherein the last-stage logic B unit adds the sum results of the pre-stage Logic B units in the ternary number format as follows: (B6+B4)+(B2+B0). Each of these logic B unit may be internally arranged as shown in FIG. 13.

In the circuit for outputting the least significant digit value of a finally calculated add result of ternary number, when the addition of B2+B0 is considered (B2 is a ternary number as represented by "B22 B21 B20", B0 is also a ternary number "B02 B01 B00"), the truth table of an output Y0 (=Y02 Y01 Y00) is as follows.

TABLE 3

| B2 | B0 | Y0 | Y02 | Y01 | Y00 |
|----|----|----|-----|-----|-----|
| 0  | 0  | 0  | 1   | 0   | 0   |
| 0  | 1  | 1  | 0   | 1   | 0   |
| 0  | 2  | 2  | 0   | 0   | 1   |
| 1  | 0  | 1  | 0   | 1   | 0   |
| 1  | 1  | 2  | 0   | 0   | 1   |
| 1  | 2  | 0  | 1   | 0   | 0   |
| 2  | 0  | 2  | 0   | 0   | 1   |
| 2  | 1  | 0  | 1   | 0   | 0   |
| 2  | 2  | 1  | 0   | 1   | 0   |

The output of the last-stage logic B unit is represented by:

$$\begin{cases} Y02 = B20 \cdot B00 + B21 \cdot B02 + B22 \cdot B01, \\ Y01 = B20 \cdot B01 + B21 \cdot B00 + B22 \cdot B02, \\ Y00 = B20 \cdot B02 + B21 \cdot B01 + B22 \cdot B00. \end{cases} \quad (9)$$

In case where the input binary number is odd its digit number, a logic circuitry shown in FIG. 13 may preferably used to produce a remainder when the upper three digits of such an odd binary number is divided by 3. The truth table indicating the relation between "AS A7 A6" and "B60 B61 B60" is shown in Table 4 as presented below.

TABLE 4

| A8 | A7 | A6 | B7 | B6 | B62 | B61 | B60 |
|----|----|----|----|----|-----|-----|-----|
| 0  | 0  | 0  | 0  | 0  | 0   | 0   | 1   |
| 0  | 0  | 1  | 0  | 1  | 0   | 1   | 0   |
| 0  | 1  | 0  | 0  | 2  | 1   | 0   | 0   |
| 0  | 1  | 1  | 1  | 0  | 0   | 0   | 1   |
| 1  | 0  | 0  | 1  | 1  | 0   | 1   | 0   |
| 1  | 0  | 1  | 1  | 2  | 1   | 0   | 0   |
| 1  | 1  | 0  | 2  | 0  | 0   | 0   | 1   |
| 1  | 1  | 1  | 2  | 1  | 0   | 1   | 0   |

The calculation equation for B60 B61 B60 is as follows.

$$\begin{cases} B60 = \overline{A8}\ \overline{A7}\ \overline{A6} + \overline{A8}\ A7\ A6 + A8\ A7\ \overline{A6}, \\ B61 = \overline{A8}\ \overline{A7}\ A6 + A8\ \overline{A7}\ \overline{A6} + A8\ A7\ A6, \\ B62 = \overline{A8}\ A7\ \overline{A6} + A8\ \overline{A7}\ A6. \end{cases} \quad (10)$$

Figure 14:
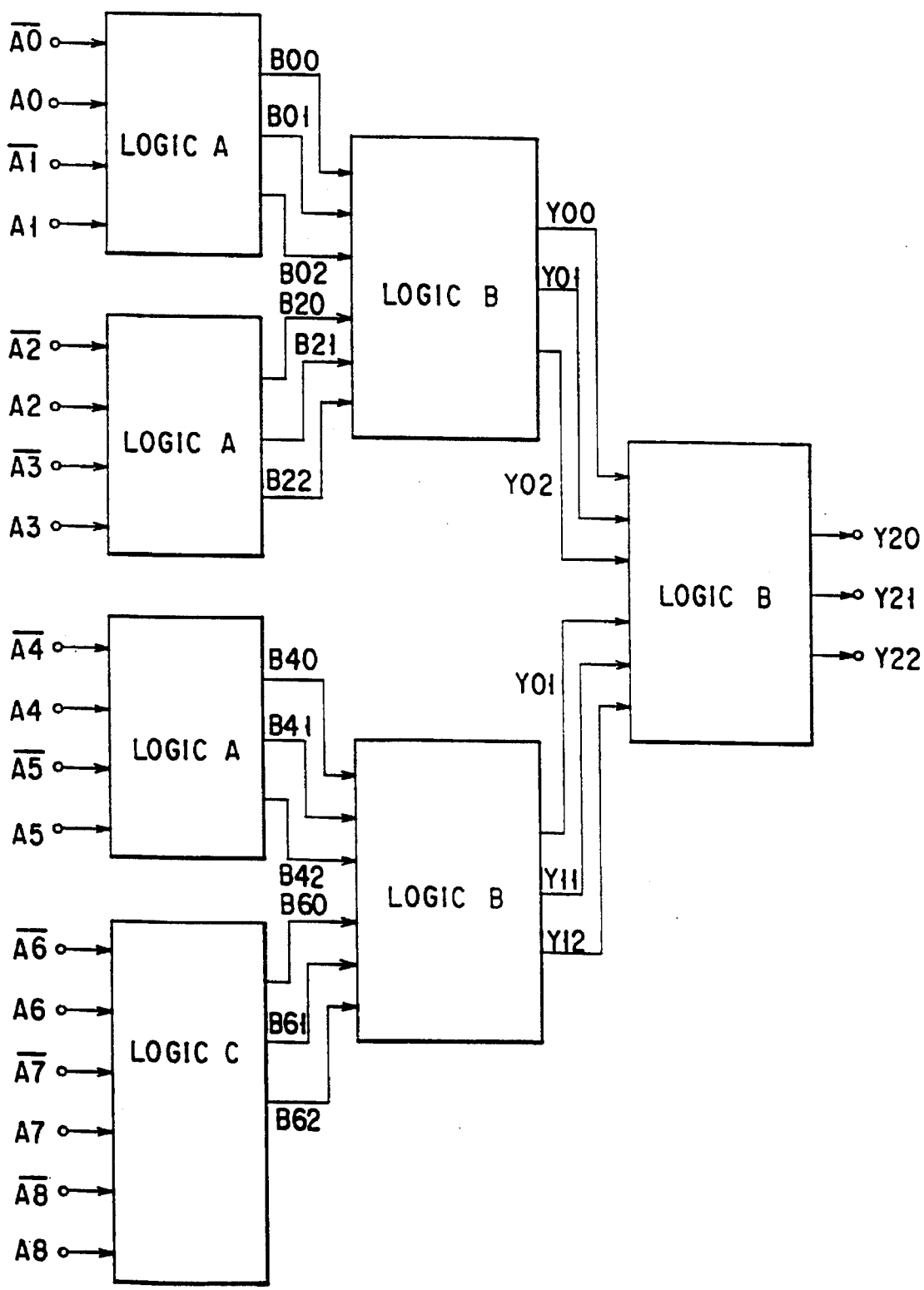
FIG. 14 is a diagram showing a binary to ternary conversion logic circuit also embodying the invention, which circuit is arranged by combining the combination of the logic circuitry of FIG. 10 with the third logic unit of FIG. 13.

Assume that the binary number is a 9-digit binary number. In this case, a logic circuit may be arranged as shown in FIG. 14. This logic circuit is similar to that of FIG. 10 with one of the logic A units, which has inputs $\overline{A6}$, A6, $\overline{A7}$, A7 and outputs B60, B61, B62, being replaced with the logic circuit of FIG. 13 as a logic C unit. Alternatively, the logic circuit may be arranged as shown in FIG. 15, which employs only the logic A circuits and the logic B circuits of FIG. 10 by utilizing a dummy digit(s).

Figure 16:
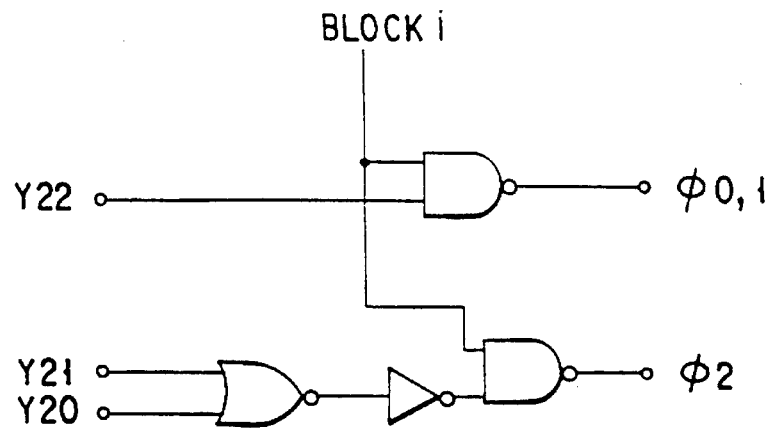
FIG. 16 is a diagram showing a clock signal generator circuitry to be preferably applied to the memory system of FIG. 1, which circuitry has two outputs coupled to clock signal lines $\phi 0,1$ and $\phi 2$, respectively.

FIG. 16 shows an exemplary case where the above binary-to-ternary conversion logic circuit, which provides a remainder when an input binary number is divided by 3, is applied to the open/folded bit-line type DRAM device in accordance with the embodiment of FIG. 1, as a clock signal generator circuit for producing the control clock signals φ0,1 and φ2. The clock signal generator circuit of FIG. 16 receives the output (that is the least significant bit Y0 of a ternary-number remainder, where Y0=Y22 Y21 Y20) of the binary-to-ternary conversion logic circuit as shown in FIGS. 10, 14 or 15; the circuit supplies the clock signals φ0,1 and φ2 to the clock signal transmission lines in the memory cell array of FIG. 1, thereby to control the turn-on/off operations of corresponding ones of the switching MOSFETs. A signal BLOCKi of FIG. 16, which is supplied to one input of a NAND gate, is a signal which can become different in potential with respect to each of the clock signals φ0,1 and φ2. With such a logic configuration, the control clock signal generator incorporating the embodiment DRAM of FIG. 1 can be provided while having the generator more compact in size. Obviously, the clock signal generator circuit of FIG. 16 may also be applied to the others of the aforementioned embodiments as described previously with reference to FIGS. 4, 5 and 8. The above logic circuit may also be employed to the selection of a dummy word line.

Figure 17:
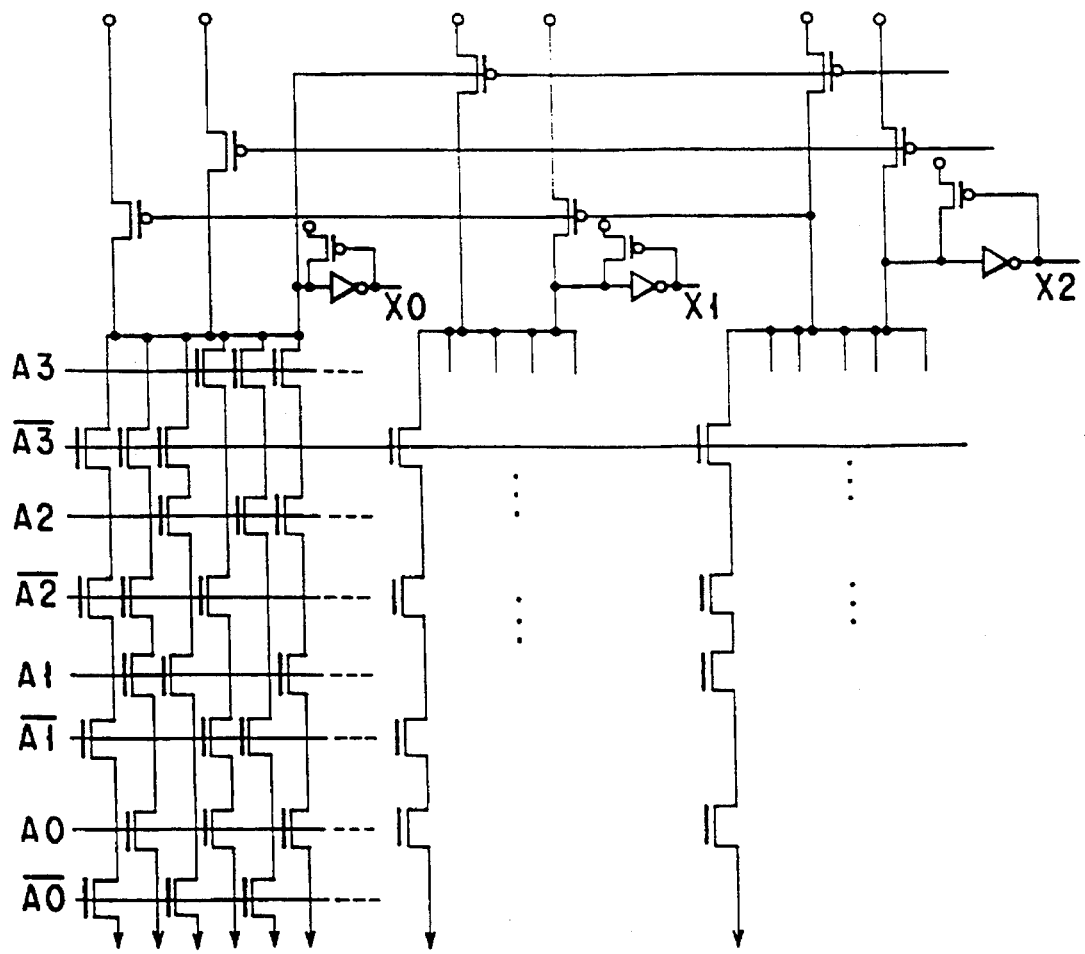

Note here that, although the binary number input the binary-to-ternary conversion logic circuit is sub-divided into sections each consisting of two digits in the above embodiments, it may alternatively be arranged so that the input binary number is subdivided into sections each consisting of four digits. One preferred embodiment of such a logic circuit is shown in FIG. 17. The logic circuit may also be accomplished by making use of smaller circuits in such a manner that, instead of a circuit configuration using ordinary CMOS transistors, a specific circuit is employed which forces X0, X1, X2 to be fed back to other circuits respectively (for example, X0 is fed back to X1, X2 of another circuit) and to be latched therein. In this case, the circuit configuration can be further miniaturized.

Figure 12:
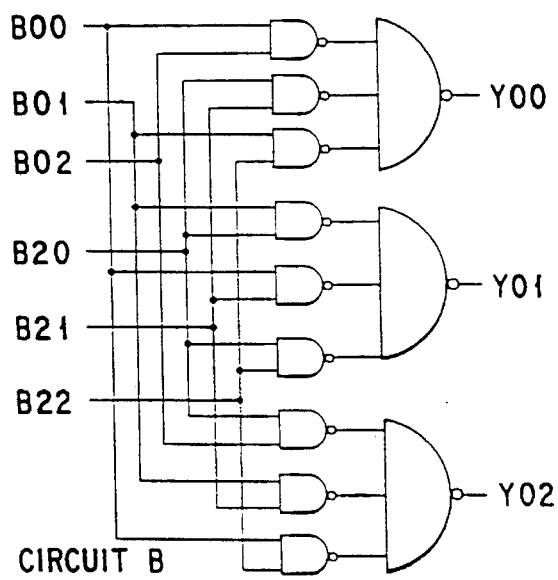
FIG. 12 shows a second internal logic unit used in the circuit of FIG. 10.
Figure 18A:
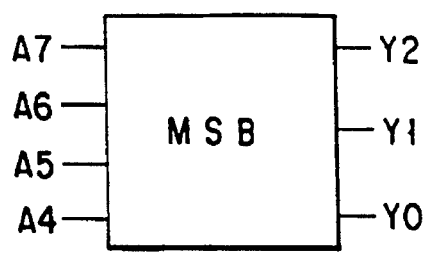
FIGS. 18A–18D illustrate four possible logic-circuit configurations which may be applied to the logic circuit of FIG. 17, each of which is arranged to generate the lower one-digit of an arithmetic sum of the outputs of the FIG. 17 circuit.
Figure 18B:
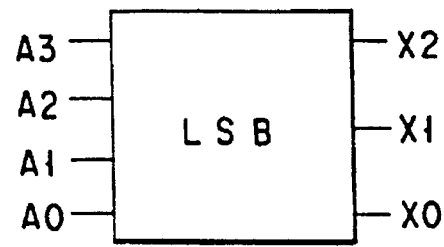
Figure 18C:
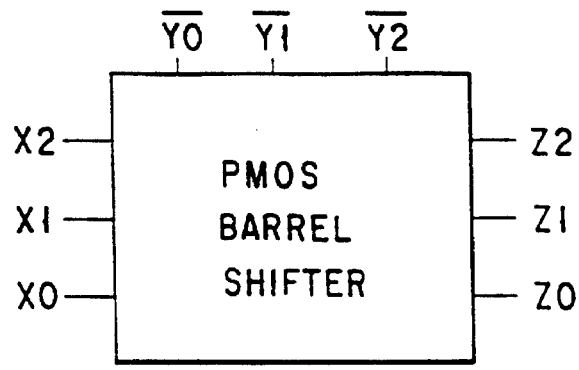
Figure 18D:
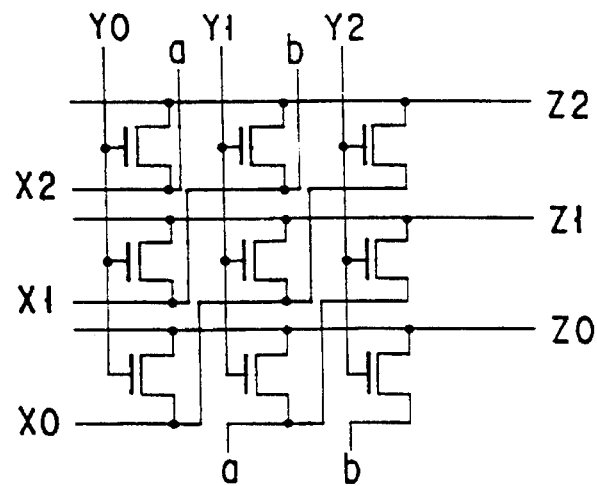

Four possible exemplary circuits are illustrated in FIGS. 18A–18D, each of which is a circuit section for outputting the least significant digit (bit) of a sum of the outputs of the circuit of FIG. 17, and which is arranged using a shifter rather than the logic B circuit of FIG. 12. The circuits of FIGS. 18A and 18B are similar to that of FIG. 17. The circuit of FIG. 18C is a PMOS barrel shifter circuit, the internal configuration of which is shown in FIG. 18D. The truth table of the circuit of FIGS. 18C–18D is as follows:

TABLE 5

| Yi | Xi | Ternary Number | Z2 | Z1 | Z0 |
|----|----|----|----|----|----|
| 0 | 0 | 0 | 0 | 0 | 1 |
| 0 | 1 | 1 | 0 | 1 | 0 |
| 0 | 2 | 2 | 1 | 0 | 0 |
| 1 | 0 | 1 | 0 | 1 | 0 |
| 1 | 1 | 2 | 1 | 0 | 0 |
| 1 | 2 | 0 | 0 | 0 | 1 |
| 2 | 0 | 2 | 1 | 0 | 0 |
| 2 | 1 | 0 | 0 | 0 | 1 |
| 2 | 2 | 1 | 0 | 1 | 0 |

The above arrangement of subdividing the input binary number into 2-digit sections may be modified as follows. Now the input binary number is assumed to be 5-digit number for purposes of explanation. Letting the 5-digit binary number be represented by "A4 A3 A2 A1 A0", the number is specifically subdivided into sections as follows:

$$
\begin{aligned}
A4\,A3\,A2\,A1\,A0 &\\
= A4 \cdot 2^4 + A3 \cdot 2^3 + A2 \cdot 2^2 + A1 \cdot 2^1 + A0 \cdot 2^0 &\\
= (A4 \cdot 2 + A3) \cdot 2^3 + A2 \cdot 2^2 + A1 \cdot 2^1 + A0 &\\
= 2(A4 \cdot 2 + A3)(3 + 1) + A2 \cdot 2^2 + A1 \cdot 2^1 + A0 &\\
= 2(B4 \cdot 3 + B3)(3 + 1) + B2 \cdot 9 + B1 \cdot 3 + B0 &\\
= 3K + (B3 + B3 + B0).
\end{aligned}
\tag{11}
$$

If the resultant least significant digit (bit) of each section is $2^{2n-2}$ (n is an integer), an output ternary number is subjected to an adding process in the ternary number format. If the least significant digit is $2^{2n-1}$, an output is doubled in the ternary number format; alternatively, the output may be subjected to the adding process twice in the ternary number format to generate an added result that is a ternary number having the least significant digit, which is then sent forth as an output.

As is apparent from the above explanation, with the binary-to-ternary conversion logic circuit embodying the invention, it becomes possible to provide a remainder of an input binary number being divided by 3 while the required circuit for attaining the logic function can be simplified in configuration. This means that the applicability can be expanded. In particular, such a binary-to-ternary conversion logic circuit can preferably be applied to the highly integrated open/folded bit-line type DRAMs as described previously with reference to FIGS. 1–9, as a control clock signal generator circuit. Conventionally, in case where a remainder is calculated when a multiple-digit binary number is divided by 3, each of a number of inputs is subjected a logical sum (AND) process with the result of a corresponding logic circuit being complicated in configuration, thus requiring the necessary chip area to increase. In contrast, with the embodiment, a ternary number is calculated by (1) subdividing an input binary number into unit section of predetermined digits with respect to the entire digits between the least significant digit and the most significant digit, (2) dividing each section by 3, (3) calculating a resultant remainder for each section, and (4) adding the outputs together in the ternary number format. The least significant digit (bit) of such ternary number is specifically used in the generation of control clock signals $\phi 0,1$ and $\phi 2$.

This can make a corresponding logic circuit more simple in configuration even if the total digit number of an input binary number is increased.

The present invention is not limited to the above-described specific embodiments and may be practiced or embodied in still other ways without departing from the spirit or essential character thereof.

What is claimed is:

1. A semiconductor memory device comprising:

a substrate;

a plurality of word lines formed on said substrate;

a plurality of bit lines transverse to said word lines formed on said substrate, said bit lines being divided into a plurality of bit line groups;

an array of memory cells selectively arranged at a plurality of cross points defined between said word lines and said bit lines, every two of said memory cells being arranged respectively at two of every adjacent three of the cross points in each of row and column directions along the bit lines and word lines, and said array of memory cells being divided into a plurality of subarray sections in a direction along the bit lines, said memory cells each being assembled by at least one capacitor formed of a storage-node layer and a plate electrode insulatively disposed over said storage-node layer and at least one MOS transistor, and said bit lines being formed after said plate electrode has been formed;

a plurality of sense amplifiers each connected between two of said bit line groups which are adjacent to each other in the row direction along the bit lines, said sense amplifiers including a first sense amplifier connected to two of said bit lines of one of said bit line groups in a folded bit-line scheme and a second sense amplifier arranged adjacent to said first sense amplifier and connected between said one of said bit line groups and the other which is neighboring thereto, in an open bit-line scheme;

a plurality of switching sections including a first switching circuit connected between said first sense amplifier and one of said bit line groups which is arranged between said first and second sense amplifiers and two second switching circuits, one of the two second switching circuits connected between said second sense amplifier and one of said adjacent two bit line groups and the other of the two second switching circuits connected between said second sense amplifier and the other of said adjacent two bit line groups, said first switching circuit including switching elements connected to the four bit lines of one of said bit line groups and driven to connect said first sense amplifier to the bit lines of said one of said bit line groups in the folded bit-line scheme, and each of said two second switching circuits including switching elements connected to the two bit lines of one of said bit line groups and driven to connect the bit lines of said adjacent two bit line groups to said second sense amplifier in the open bit line scheme.

2. A semiconductor memory device comprising:

a substrate;

a plurality of word lines formed on said substrate;

a plurality of bit lines transverse to said word lines formed on said substrate, said bit lines being divided into a plurality of bit line groups;

an array of memory cells selectively arranged at a plurality of cross points defined between said word lines and said bit lines, every two of said memory cells being arranged respectively at two of every adjacent three of the cross points in each of row and column directions along the bit lines and word lines, and said array of memory cells being divided into a plurality of subarray sections in a direction along the bit lines, said memory cells each being assembled by at least one capacitor formed of a storage-node layer and a plate electrode insulatively disposed over said storage-node layer and at least one MOS transistor, and said plate electrode being formed after said bit lines have been formed;

a plurality of sense amplifiers each connected between two of said bit line groups which are adjacent to each other in the row direction along the bit lines, said sense amplifiers including a first sense amplifier connected to two of said bit lines of one of said bit line groups in a folded bit-line scheme and a second sense amplifier arranged adjacent to said first sense amplifier and connected between said one of said bit line groups and the other which is neighboring thereto, in an open bit-line scheme;

a plurality of switching sections including a first switching circuit connected between said first sense amplifier and one of said bit line groups which is arranged between said first and second sense amplifiers and two second switching circuits, one of the two second switching circuits connected between said second sense amplifier and one of said adjacent two bit line groups and the other of the two second switching circuits connected between said second sense amplifier and the other of said adjacent two bit line groups, said first switching circuit including switching elements connected to the four bit lines of one of said bit line groups and driven to connect said first sense amplifier to the bit lines of said one of said bit line groups in the folded bit-line scheme, and each of said second switching circuits including switching elements connected to the two bit lines of one of said bit line groups and driven to connect the bit lines of said adjacent two bit line groups to said second sense amplifier in the open bit line scheme.

3. A semiconductor memory device comprising:

a substrate;

a plurality of word lines formed on said substrate;

a plurality of bit lines transverse to said word lines formed on said substrate, said bit lines being divided into a plurality of bit line groups;

an array of memory cells selectively arranged at a plurality of cross points defined between said word lines and said bit lines, every two of said memory cells being arranged respectively at two of every adjacent three of the cross points in each of row and column directions along the bit lines and word lines, and said array of memory cells being divided into a plurality of subarray sections in a direction along the bit lines, said memory cells each being a trench type cell including at least one trench capacitor formed inside said substrate and at least one MOS transistor;

a plurality of sense amplifiers each connected between two of said bit line groups which are adjacent to each other in the row direction along the bit lines, said sense amplifiers including a first sense amplifier connected to two of said bit lines of one of said bit line groups in a folded bit-line scheme and a second sense amplifier arranged adjacent to said first sense amplifier and connected between said one of said bit line groups and the other which is neighboring thereto, in an open bit-line scheme;

a plurality of switching sections including a first switching circuit connected between said first sense amplifier and one of said bit line groups which is arranged between said first and second sense amplifiers and two second switching circuits, one of the two second switching circuits connected between said second sense amplifier and one of said adjacent two bit line groups and the other of the two second switching circuits connected between said second sense amplifier and the other of said adjacent two bit line groups, said first switching circuit including switching elements connected to the four bit lines of one of said bit line groups and driven to connect said first sense amplifier to the bit lines of said one of said bit line groups in the folded bit-line scheme, and each of said second switching circuits including switching elements connected to the two bit lines of one of said bit line groups and driven to connect the bit lines of said adjacent two bit line groups to said second sense amplifier in the open bit line scheme.

4. A semiconductor memory device according to any one of claims 1, 2 or 3, wherein said bit lines include first and second bit line pairs, said first switching means includes first and second switching element pairs, two switching elements of one of said pairs having first terminals connected respectively to adjacent two of said bit lines and second terminals connected to each other and a first terminal of said first sense amplifier, and two switching elements of the other of said pairs having first terminals connected respectively to adjacent two of said bit lines and second terminals connected to each other and a second terminal of said first sense amplifier.

5. A semiconductor memory device according to any one of claims 1, 2 or 3, wherein said bit lines include first and second bit line pairs between which said second sense amplifier is arranged, said second switching means includes first and second switching element pairs, two switching elements of one of said pairs having first terminals connected respectively to adjacent two of said bit lines and second terminals connected to each other and a first terminal of said second sense amplifier, and two switching elements of the other of said pairs having first terminals connected respectively to adjacent two of said bit lines and second terminals connected to each other and a second terminal of said second sense amplifier.

6. A semiconductor memory device according to any one of claims 1, 2 or 3, wherein said sense amplifiers include a plurality of first sense amplifiers and a plurality of second sense amplifiers, each of said second sense amplifiers being arranged between adjacent two of said first sense amplifiers;

said subarray sections include a first subarray section arranged between one of said second sense amplifiers and one of said first sense amplifiers and a second subarray section arranged between said one of said second sense amplifiers and another of said first sense amplifiers;

said bit lines include first to fourth bit lines extending between one of said second sense amplifiers and one of said first sense amplifiers and fifth to eighth bit lines extending between said one of said second sense amplifiers and another one of said first sense amplifiers;

said first switching means includes first and second switching element pairs, two switching elements of one of said pairs having first terminals connected respectively to said first and second bit lines and second terminals connected to each other and a first terminal of said first sense amplifier and two switching elements of the other of said pairs having first terminals connected respectively to said third and fourth bit lines and second terminals connected to each other and a second terminal of said first sense amplifier;

said second switching means includes third and fourth switching element pairs, two switching elements of one of said pairs having first terminals connected respectively to said second and third bit lines and second terminals connected to each other and a first terminal of said second sense amplifier and two switching elements of the other of said pairs having first terminals connected respectively to said sixth and seventh bit lines and second terminals connected to each other and a second terminal of said second sense amplifier.

7. A semiconductor memory device according to any one of claims 1, 2 or 3, further comprising a binary to ternary conversion logic circuit for receiving an input binary number comprising a plurality of digits and generating a remainder obtained by when said input binary number is divided by three as a control signal supplied to said switching section, to selectively connect said sense amplifiers to said bit lines in the folded bit-line scheme and the open bit-line scheme.

8. A semiconductor memory device according to claim 7, wherein said binary to ternary conversion logic circuit comprises:

data transfer means for subdividing the input binary number into a plurality of sections each having a predetermined number of digits being as a unit, said unit being sequentially defined by counting up the digits from a least significant digit of said input binary number;

first circuit means comprising circuits for each receiving the signal from said subdivided unit as being the least significant bit for each circuit and for each generating a remainder obtained divided by three; and second circuit means connected to said first circuit, for generating a least significant digit of a ternary number which is obtained by adding together outputs of said first circuit means.

9. A semiconductor memory device comprising:

a substrate;

a plurality of word lines formed on said substrate;

a plurality of bit lines transverse to said word lines formed on said substrate;

an array of memory cells selectively arranged at a plurality of cross points defined between said word lines and said bit lines, every two of said memory cells being arranged respectively at two of every adjacent three of the cross points in each of row and column directions along the bit lines and word lines, and said array of memory cells being divided into a plurality of subarray sections in the row direction along the bit lines, said memory cells each being assembled by at least one capacitor formed of a storage-node layer and a plate electrode insulatively disposed over said storage-node layer and at least one MOS transistor, and said bit lines being formed after said plate electrode has been formed; and a plurality of sense amplifiers each connected between adjacent two of said subarray sections and to said bit lines, adjacent two of said sense amplifiers operating, in a reading mode, in a folded bit-line scheme, and in a writing mode, in a folded bit-line scheme and an open bit-line scheme, respectively.

10. A semiconductor memory device comprising:

a substrate;

a plurality of word lines formed on said substrate;

a plurality of bit lines transverse to said word lines formed on said substrate;

an array of memory cells selectively arranged at a plurality of cross points defined between said word lines and said bit lines, every two of said memory cells being arranged respectively at two of every adjacent three of the cross points in each of row and column directions along the bit lines and word lines, and said array of memory cells being divided into a plurality of subarray sections in the row direction along the bit lines, said memory cells each being assembled by at least one capacitor formed of a storage-node layer and a plate electrode insulatively disposed over said storage-node layer and at least one MOS transistor, and said plate electrode being formed after said bit lines have been formed; and a plurality of sense amplifiers each connected between adjacent two of said subarray sections and to said bit lines, adjacent two of said sense amplifiers operating, in a reading mode, in a folded bit-line scheme, and in a writing mode, in a folded bit-line scheme and an open bit-line scheme, respectively.

11. A semiconductor memory device comprising:

a substrate;

a plurality of word lines formed on said substrate;

a plurality of bit lines transverse to said word lines formed on said substrate;

an array of memory cells selectively arranged at a plurality of cross points defined between said word lines and said bit lines, every two of said memory cells being arranged respectively at two of every adjacent three of the cross points in each of row and column directions along the bit lines and word lines, and said array of memory cells being divided into a plurality of subarray sections in the row direction along the bit lines, said memory cells each being assembled by at least one trench capacitor formed inside said substrate and at least one MOS transistor; and a plurality of sense amplifiers each connected between adjacent two of said subarray sections and to said bit lines, adjacent two of said sense amplifiers operating, in a reading mode, in a folded bit-line scheme, and in a writing mode, in a folded bit-line scheme and an open bit-line scheme, respectively.

12. A semiconductor memory device according to any one of claims 9, 10 or 11, wherein said bit lines are divided into a plurality of bit line groups having first and second bit line groups, with said sense amplifiers including a first sense amplifier arranged adjacent to said first line group and a second sense amplifier arranged between said first bit line group and said second bit line group, and said semiconductor memory device includes first switching means connected between said first bit line group and said first sense amplifier, second switching means connected between said first bit line group and said second sense amplifier, and third switching means connected between said second bit line group and said second sense amplifier, said first to third switching means being ON/OFF-controlled to operate said first and second sense amplifiers in a folded bit-line scheme in the reading mode and to operate them in a folded bit-line scheme and an open bit-line scheme in the writing mode, respectively.

13. A semiconductor memory device according to any one of claims 9, 10 or 11, further comprising a binary to ternary conversion logic circuit for receiving an input binary number comprising a plurality of digits and generating a remainder obtained by when said input binary number is divided by three as a control signal supplied to said switching section, to selectively connect said sense amplifiers to said bit lines in the folded bit-line scheme and the open bit-line scheme.

14. A semiconductor memory device according to claim 13, wherein said binary to ternary conversion logic circuit comprises:

first circuit means for subdividing the input binary number into a plurality of sections each having a predetermined number of digits being as a unit, said unit being sequentially defined by counting up the digits from a least significant digit of said input binary number; and second circuit means connected to said first circuit, for generating a least significant digit of a ternary number which is obtained by adding together outputs of said first circuit means.

15. A semiconductor memory device comprising:

a substrate;

a plurality of word lines formed on said substrate;

a plurality of bit lines transverse to said word lines formed on said substrate, said bit lines being divided into a plurality of bit line groups each having three bit lines;

an array of memory cells selectively arranged at a plurality of cross points defined between said word lines and said bit lines, every two of said memory cells being arranged respectively at two of every adjacent three of the cross points in each of row and column directions along the bit lines and word lines, and said array of memory cells being divided into a plurality of subarray sections in the row direction along the bit lines, said memory cells each being assembled by at least one capacitor formed of a storage-node layer and a plate electrode insulatively disposed over said storage-node layer and at least one MOS transistor, and said bit lines being formed after said plate electrode has been formed; and a plurality of sense amplifiers each connected between adjacent two of said bit line groups in the row direction along the bit lines, said sense amplifiers including a first sense amplifier connected to two of said three bit lines of each of said bit line groups in a folded bit-line scheme and a second sense amplifier arranged neighboring to said first sense amplifier and connected between two of said bit line groups, which are adjacent to each other in the row direction of the bit lines, in an open bit-line scheme; and a plurality of switching sections including a first switching circuit connected between said first sense amplifier and one of said bit line groups which is adjacent to said second sense amplifier and two second switching circuits connected, respectively, between said second sense amplifier and said adjacent two bit line groups, said first switching circuit including three switching elements connected respectively to the three bit lines of one of said bit line groups and driven to connect said first sense amplifier to the bit lines of said one of said bit line groups in the folded bit-line scheme, and each of said second switching circuits including three switching elements connected to the three bit lines of one of said bit line groups and driven to connect the bit lines of said adjacent two bit line groups to said second sense amplifier in the open bit-line scheme.

16. A semiconductor memory device comprising:

a substrate;

a plurality of word lines formed on said substrate;

a plurality of bit lines transverse to said word lines formed on said substrate, said bit lines being divided into a plurality of bit line groups each having three bit lines;

an array of memory cells selectively arranged at a plurality of cross points defined between said word lines and said bit lines, every two of said memory cells being arranged respectively at two of every adjacent three of the cross points in each of row and column directions along the bit lines and word lines, and said array of memory cells being divided into a plurality of subarray sections in the row direction along the bit lines, said memory cells each being assembled by at least one capacitor formed of a storage-node layer and a plate electrode insulatively disposed over said storage-node layer and at least one MOS transistor, and said plate electrode being formed after said bit lines have been formed; and a plurality of sense amplifiers each connected between adjacent two of said bit line groups in the row direction along the bit lines, said sense amplifiers including a first sense amplifier connected to two of said three bit lines of each of said bit line groups in a folded bit-line scheme and a second sense amplifier arranged neighboring to said first sense amplifier and connected between two of said bit line groups, which are adjacent to each other in the row direction of the bit lines, in an open bit-line scheme; and a plurality of switching sections including a first switching circuit connected between said first sense amplifier and one of said bit line groups which is adjacent to said second sense amplifier and two second switching circuits connected, respectively, between said second sense amplifier and said adjacent two bit line groups, said first switching circuit including three switching elements connected respectively to the three bit lines of one of said bit line groups and driven to connect said first sense amplifier to the bit lines of said one of said bit line groups in the folded bit-line scheme, and each of said second switching circuits including three switching elements connected to the three bit lines of one of said bit line groups and driven to connect the bit lines of said adjacent two bit line groups to said second sense amplifier in the open bit-line scheme.

17. A semiconductor memory device comprising:

a substrate;

a plurality of word lines formed on said substrate;

a plurality of bit lines transverse to said word lines formed on said substrate, said bit lines being divided into a plurality of bit line groups each having three bit lines;

an array of memory cells selectively arranged at a plurality of cross points defined between said word lines and said bit lines, every two of said memory cells being arranged respectively at two of every adjacent three of the cross points in each of row and column directions along the bit lines and word lines, and said array of memory cells being divided into a plurality of subarray sections in the row direction along the bit lines, said memory cells each being assembled by at least one trench capacitor formed inside said substrate and at least one MOS transistor; and a plurality of sense amplifiers each connected between adjacent two of said bit line groups in the row direction along the bit lines, said sense amplifiers including a first sense amplifier connected to two of said three bit lines of each of said bit line groups in a folded bit-line scheme and a second sense amplifier arranged neighboring to said first sense amplifier and connected between two of said bit line groups, which are adjacent to each other in the row direction of the bit lines, in an open bit-line scheme; and a plurality of switching sections including a first switching circuit connected between said first sense amplifier and one of said bit line groups which is adjacent to said second sense amplifier and two second switching circuits connected, respectively, between said second sense amplifier and said adjacent two bit line groups, said first switching circuit including three switching elements connected respectively to the three bit lines of one of said bit line groups and driven to connect said first sense amplifier to the bit lines of said one of said bit line groups in the folded bit-line scheme, and each of said second switching circuits including three switching elements connected to the three bit lines of one of said bit line groups and driven to connect the bit lines of said adjacent two bit line groups to said second sense amplifier in the open bit-line scheme.

18. A semiconductor memory device according to any one of claims 15, 16 or 17, wherein the three switching elements of said first switching circuit include first and second switching elements each connected between a corresponding one of the three bit lines and a first terminal of said first sense amplifier and a third switching element connected between a corresponding one of the three bit lines and a second terminal of said first sense amplifier, and the three switching elements of one of said second switching circuits include fourth and fifth switching elements each connected between a corresponding one of the three bit lines and a first terminal of said second sense amplifier and a sixth switching element connected between a corresponding one of the three bit lines and a second terminal of said second sense amplifier, and the three switching elements of the other of said second switching circuits include seventh and eighth switching elements each connected between a corresponding one of the three bit lines and the second terminal of said second sense amplifier and a ninth switching element connected between a corresponding one of the three bit lines and the first terminal of said second sense amplifier.

19. A semiconductor memory device according to any one of claims 15, 16 or 17, further comprising a binary to ternary conversion logic circuit for receiving an input binary number comprising a plurality of digits and generating a remainder obtained by when said input binary number is divided by three as a control signal supplied to said switching section, to selectively connect said sense amplifiers to said bit lines in the folded bit-line scheme and the open bit-line scheme.

20. A semiconductor memory device according to claim 19, wherein said binary to ternary conversion logic circuit comprises first circuit means for subdividing the input binary number into a plurality of sections each having a predetermined number of digits being as a unit, said unit being sequentially defined by counting up the digits from a least significant digit of said input binary number; and second circuit means connected to said first circuit, for generating a least significant digit of a ternary number which is obtained by adding together outputs of said first circuit means.

21. A semiconductor memory device comprising:

a substrate;

a plurality of word lines formed on said substrate;

a plurality of bit lines transverse to said word lines formed on said substrate, said bit lines being divided into a plurality of bit line groups;

an array of memory cells selectively arranged at a plurality of cross points defined between said word lines and said bit lines, every two of said memory cells being arranged respectively at two of every adjacent three of the cross points in each of row and column directions along the bit lines and word lines, and said array of memory cells being divided into a plurality of subarray sections in a direction along the bit lines;

a plurality of sense amplifiers each connected between two of said bit line groups which are adjacent to each other in the row direction along the bit lines, said sense amplifiers including a first sense amplifier connected to two of said bit lines of one of said bit line groups in a folded bit-line scheme and a second sense amplifier arranged adjacent to said first sense amplifier and connected between said one of said bit line groups and the other which is neighboring thereto, in an open bit-line scheme;

a plurality of switching sections including a first switching circuit connected between said first sense amplifier and one of said bit line groups which is arranged between said first and second sense amplifiers and two second switching circuits, one of the two second switching circuits connected between said second sense amplifier and one of said adjacent two bit line groups and the other of the two second switching circuits connected between said second sense amplifier and the other of said adjacent two bit line groups, said first switching circuit including switching elements connected to the four bit lines of one of said bit line groups and driven to connect said first sense amplifier to the bit lines of said one of said bit line groups in the folded bit-line scheme, and each of said second switching circuits including switching elements connected to the two bit lines of one of said bit line groups and driven to connect the bit lines of said adjacent two bit line groups to said second sense amplifier in the open bit line scheme, said switching elements of said first and second switching circuits being arranged with being shifted at three or four steps in a direction along the bit lines.

22. A semiconductor memory device comprising:

a substrate;

a plurality of word lines formed on said substrate;

a plurality of bit lines transverse to said word lines formed on said substrate, said bit lines being divided into a plurality of bit line groups;

an array of memory cells selectively arranged at a plurality of cross points defined between said word lines and said bit lines, every two of said memory cells being arranged respectively at two of every adjacent three of the cross points in each of row and column directions along the bit lines and word lines, and said array of memory cells being divided into a plurality of subarray sections in a direction along the bit lines, said memory cells each being assembled by at least one capacitor formed of a storage-node layer and a plate electrode insulatively disposed over said storage-node layer and at least one MOS transistor, and said plate electrode being formed after said bit lines have been formed;

a plurality of sense amplifiers each connected between two of said bit line groups which are adjacent to each other in the row direction along the bit lines, said sense amplifiers including a first sense amplifier connected to two of said bit lines of one of said bit line groups in a folded bit-line scheme and a second sense amplifier arranged adjacent to said first sense amplifier and connected between said one of said bit line groups and the other which is neighboring thereto, in an open bit-line scheme;

a plurality of switching sections including a first switching circuit connected between said first sense amplifier and one of said bit line groups which is arranged between said first and second sense amplifiers and two second switching circuits, one of the two second switching circuits connected between said second sense amplifier and one of said adjacent two bit line groups and the other of the two second switching circuits connected between said second sense amplifier and the other of said adjacent two bit line groups, said first switching circuit including switching elements connected to the four bit lines of one of said bit line groups and driven to connect said first sense amplifier to the bit lines of said one of said bit line groups in the folded bit-line scheme, and each of said second switching circuits including switching elements connected to the two bit lines of one of said bit line groups and driven to connect the bit lines of said adjacent two bit line groups to said second sense amplifier in the open bit line scheme, said switching elements of said first and second switching circuits being arranged with being shifted at three or four steps in a direction along the bit lines.

23. A semiconductor memory device comprising:

a substrate;

a plurality of word lines formed on said substrate;

a plurality of bit lines transverse to said word lines formed on said substrate, said bit lines being divided into a plurality of bit line groups;

an array of memory cells selectively arranged at a plurality of cross points defined between said word lines and said bit lines, every two of said memory cells being arranged respectively at two of every adjacent three of the cross points in each of row and column directions along the bit lines and word lines, and said array of memory cells being in the row direction along the bit lines, said sense amplifiers including a first sense amplifier connected to two type cell including at least one capacitor formed inside said substrate and at least one MOS transistor;

a plurality of sense amplifiers each connected between two of said bit line groups which are adjacent to each other in the row direction along the bit lines, said sense amplifiers including a first sense amplifier connected to two of said bit lines of one of said bit line groups in a folded bit-line scheme and a second sense amplifier arranged adjacent to said first sense amplifier and connected between said one of said bit line groups and the other which is neighboring thereto, in an open bit-line scheme;

a plurality of switching sections including a first switching circuit connected between said first sense amplifier and one of said bit line groups which is arranged between said first and second sense amplifiers and two second switching circuits, one of the two second switching circuits connected between said second sense amplifier and one of said adjacent two bit line groups and the other of the two second switching circuits connected between said second sense amplifier and the other of said adjacent two bit line groups, said first switching circuit including switching elements connected to the four bit lines of one of said bit line groups and driven to connect said first sense amplifier to the bit lines of said one of said bit line groups in the folded bit-line scheme, and each of said second switching circuits including switching elements connected to the two bit lines of one of said bit line groups and driven to connect the bit lines of said adjacent two bit line groups to said second sense amplifier in the open bit line scheme, said switching elements of said first and second switching circuits being arranged with being shifted at three or four steps in a direction along the bit lines.

24. A semiconductor memory device comprising:

a substrate;

a plurality of word lines formed on said substrate;

a plurality of bit lines transverse to said word lines formed on said substrate, said bit lines being divided into a plurality of bit line groups;

an array of memory cells selectively arranged at a plurality of cross points defined between said word lines and said bit lines, every two of said memory cells being arranged respectively at two of every adjacent three of the cross points in each of row and column directions along the bit lines and word lines, and said array of memory cells being divided into a plurality of subarray sections in a direction along the bit lines, said memory cells each being a single transistor memory;

a plurality of sense amplifiers each connected between two of said bit line groups which are adjacent to each other in the row direction along the bit lines;

a plurality of switching sections which are connected between said sense amplifiers and said bit lines of one of said bit line groups; and a binary to ternary conversion logic circuit for receiving an input binary number comprising a plurality of digits and generating a remainder obtained by when said input binary number is divided by three as a control signal supplied to said switching section, to selectively connect said sense amplifiers to said bit lines.

25. A semiconductor memory device according to claim 24, wherein said binary to ternary conversion logic circuit comprises:

data transfer means for subdividing the input binary number into a plurality of sections each having a predetermined number of digits being as a unit, said unit being sequentially defined by counting up the digits from a least significant digit of said input binary number;

first circuit means comprising circuits for each receiving the signal from said subdivided unit as being the least significant bit for each circuit and for each generating a remainder obtained divided by three; and second circuit means connected to said first circuit, for generating a least significant digit of a ternary number which is obtained by adding together outputs of said first circuit means.

26. A semiconductor memory cell device comprising:

a substrate;

a plurality of word lines formed on said substrate;

a plurality of bit lines transverse to said word lines formed on said substrate; and an array of memory cells selectively arranged at a plurality of cross points defined between said word lines and said bit lines, every two of said memory cells being arranged respectively at two of every adjacent three of the cross points in each of row and column directions along the bit lines and word lines, said memory cells each being assembled by at least one capacitor and at least one MOS transistor, said capacitor being formed between a storage node and a plate electrode, and adjacent two storage nodes formed, using the same conductive layers, respectively on both sides of each of said word lines overlapping on a corresponding one of said word lines at each of said cross points;

wherein said bit lines are formed after said plate electrode has been formed; and wherein said bit lines are divided into a plurality of bit line groups, and which includes:
  a plurality of sense amplifiers each connected between two of said bit line groups which are adjacent to each other in the row direction along the bit lines, said sense amplifiers including a first sense amplifier connected to two of said bit lines of one of said bit line groups in a folded bit-line scheme and a second sense amplifier arranged adjacent to said first sense amplifier and connected between said one of said bit line groups and the other which is neighboring thereto, in an open bit-line scheme;
  a plurality of switching sections including a first switching circuit connected between said first sense amplifier and one of said bit line groups which is arranged between said first and second sense amplifiers and two second switching circuits, one of the two second switching circuits connected between said second sense amplifier and one of said adjacent two bit line groups and the other of the two second switching circuits connected between said second sense amplifier and the other of said adjacent two bit line groups, said first switching circuit including switching elements connected to the four bit lines of one of said bit line groups and driven to connect said first sense amplifier to the bit lines of said one of said bit line groups in the folded bit-line scheme, and each of said second switching circuits including switching elements connected to the two bit lines of one of said bit line groups and driven to connect the bit lines of said adjacent two bit line groups to said second sense amplifier in the open bit line scheme.

27. A semiconductor memory cell device comprising:

a substrate;

a plurality of word lines formed on said substrate;

a plurality of bit lines transverse to said word lines formed on said substrate; and an array of memory cells selectively arranged at a plurality of cross points defined between said word lines and said bit lines, every two of said memory cells being arranged respectively at two of every adjacent three of the cross points in each of row and column directions along the bit lines and word lines, said memory cells each being assembled by at least one capacitor and at least one MOS transistor, said capacitor being formed between a storage node and a plate electrode, and adjacent two storage nodes formed, using the same conductive layers, respectively on both sides of each of said word lines overlapping on a corresponding one of said word lines at each of said cross points;

wherein said bit lines are formed after said plate electrode has been formed; and wherein said bit lines are divided into a plurality of bit line groups, and which includes:
  a plurality of sense amplifiers each connected between two of said bit line groups which are adjacent to each other in the row direction along the bit lines, said sense amplifiers including a first sense amplifier connected to two of said bit lines of one of said bit line groups in a folded bit-line scheme and a second sense amplifier arranged adjacent to said first sense amplifier and connected between said one of said bit line groups and the other which is neighboring thereto, in an open bit-line scheme;
  a plurality of switching sections including a first switching circuit connected between said first sense amplifier and one of said bit line groups which is arranged between said first and second sense amplifiers and two second switching circuits, one of the two second switching circuits connected between said second sense amplifier and one of said adjacent two bit line groups and the other of the two second switching circuits connected between said second sense amplifier and the other of said adjacent two bit line groups, said first switching circuit including switching elements connected to the four bit lines of one of said bit line groups and driven to connect said first sense amplifier to the bit lines of said one of said bit line groups in the folded bit-line scheme, and each of said second switching circuits including switching elements connected to the two bit lines of one of said bit line groups and driven to connect the bit lines of said adjacent two bit line groups to said second sense amplifier in the open bit line scheme.

28. A semiconductor memory cell device comprising:

a substrate;

a plurality of word lines formed on said substrate;

a plurality of bit lines transverse to said word lines formed on said substrate; and an array of memory cells selectively arranged at a plurality of cross points defined between said word lines and said bit lines, every two of said memory cells being arranged respectively at two of every adjacent three of the cross points in each of row and column directions along the bit lines and word lines, said memory cells each being assembled by at least one capacitor and at least one MOS transistor, said capacitor being formed between a storage node and a plate electrode, and adjacent two storage nodes formed, using the same conductive layers, respectively on both sides of each of said word lines overlapping on a corresponding one of said word lines at each of said cross points;

wherein said bit lines are formed after said plate electrode has been formed; and wherein said bit lines are divided into a plurality of bit line groups, and which includes:
  a plurality of sense amplifiers each connected between two of said bit line groups which are adjacent to each other in the row direction along the bit lines, said sense amplifiers including a first sense amplifier connected to two of said bit lines of one of said bit line groups in a folded bit-line scheme and a second sense amplifier arranged adjacent to said first sense amplifier and connected between said one of said bit line groups and the other which is neighboring thereto, in an open bit-line scheme;
  a plurality of switching sections including a first switching circuit connected between said first sense amplifier and one of said bit line groups which is arranged between said first and second sense amplifiers and two second switching circuits, one of the two second switching circuits connected between said second sense amplifier and one of said adjacent two bit line groups and the other of the two second switching circuits connected between said second sense amplifier and the other of said adjacent two bit line groups, said first switching circuit including switching elements connected to the four bit lines of one of said bit line groups and driven to connect said first sense amplifier to the bit lines of said one of said bit line groups in the folded bit-line scheme, and each of said second switching circuits including switching elements connected to the two bit lines of one of said bit line groups and driven to connect the bit lines of said adjacent two bit line groups to said second sense amplifier in the open bit line scheme.

29. A semiconductor memory cell device comprising:

a substrate;

a plurality of word lines formed on said substrate;

a plurality of bit lines transverse to said word lines formed on said substrate; and an array of memory cells selectively arranged at a plurality of cross points defined between said word lines and said bit lines, every two of said memory cells being arranged respectively at two of every adjacent three of the cross points in each of row and column directions along the bit lines and word lines, said memory cells each being assembled by at least one capacitor and at least one MOS transistor, said capacitor being formed between a storage node and a plate electrode, and adjacent two storage nodes formed, using the same conductive layers, respectively on both sides of each of said word lines overlapping on a corresponding one of said word lines at each of said cross points;

wherein said plate electrode is formed after said bit lines have been formed;

wherein said bit lines are divided into a plurality of bit line groups, and which includes:

a plurality of sense amplifiers each connected between two of said bit line groups which are adjacent to each other in the row direction along the bit lines, said sense amplifiers including a first sense amplifier connected to two of said bit lines of one of said bit line groups in a folded bit-line scheme and a second sense amplifier arranged adjacent to said first sense amplifier and connected between said one of said bit line groups and the other which is neighboring thereto, in an open bit-line scheme;

a plurality of switching sections including a first switching circuit connected between said first sense amplifier and one of said bit line groups which is arranged between said first and second sense amplifiers and two second switching circuits, one of the two second switching circuits connected between said second sense amplifier and one of said adjacent two bit line groups and the other of the two second switching circuits connected between said second sense amplifier and the other of said adjacent two bit line groups, said first switching circuit including switching elements connected to the four bit lines of one of said bit line groups and driven to connect said first sense amplifier to the bit lines of said one of said bit line groups in the folded bit-line scheme, and each of said second switching circuits including switching elements connected to the two bit lines of one of said bit line groups and driven to connect the bit lines of said adjacent two bit line groups to said second sense amplifier in the open bit line scheme.

30. A semiconductor memory cell device comprising:

a substrate;

a plurality of word lines formed on said substrate;

a plurality of bit lines transverse to said word lines formed on said substrate; and an array of memory cells selectively arranged at a plurality of cross points defined between said word lines and said bit lines, every two of said memory cells being arranged respectively at two of every adjacent three of the cross points in each of row and column directions along the bit lines and word lines, said memory cells each being assembled by at least one capacitor and at least one MOS transistor, said capacitor being formed between a storage node and a plate electrode, and adjacent two storage nodes formed, using the same conductive layers, respectively on both sides of each of said word lines overlapping on a corresponding one of said word lines at each of said cross points;

wherein said plate electrode is formed after said bit lines have been formed;

wherein said bit lines are divided into a plurality of bit line groups, and which includes:

a plurality of sense amplifiers each connected between two of said bit line groups which are adjacent to each other in the row direction along the bit lines, said sense amplifiers including a first sense amplifier connected to two of said bit lines of one of said bit line groups in a folded bit-line scheme and a second sense amplifier arranged adjacent to said first sense amplifier and connected between said one of said bit line groups and the other which is neighboring thereto, in an open bit-line scheme;

a plurality of switching sections including a first switching circuit connected between said first sense amplifier and one of said bit line groups which is arranged between said first and second sense amplifiers and two second switching circuits, one of the two second switching circuits connected between said second sense amplifier and one of said adjacent two bit line groups and the other of the two second switching circuits connected between said second sense amplifier and the other of said adjacent two bit line groups, said first switching circuit including switching elements connected to the four bit lines of one of said bit line groups and driven to connect said first sense amplifier to the bit lines of said one of said bit line groups in the folded bit-line scheme, and each of said second switching circuits including switching elements connected to the two bit lines of one of said bit line groups and driven to connect the bit lines of said adjacent two bit line groups to said second sense amplifier in the open bit line scheme.

31. A semiconductor memory cell device comprising:

a substrate;

a plurality of word lines formed on said substrate;

a plurality of bit lines transverse to said word lines formed on said substrate; and an array of memory cells selectively arranged at a plurality of cross points defined between said word lines and said bit lines, every two of said memory cells being arranged respectively at two of every adjacent three of the cross points in each of row and column directions along the bit lines and word lines, said memory cells each being assembled by at least one capacitor and at least one MOS transistor, said capacitor being formed between a storage node and a plate electrode, and adjacent two storage nodes formed, using the same conductive layers, respectively on both sides of each of said word lines overlapping on a corresponding one of said word lines at each of said cross points;

wherein said plate electrode is formed after said bit lines have been formed;

wherein said bit lines are divided into a plurality of bit line groups, and which includes:

a plurality of sense amplifiers each connected between two of said bit line groups which are adjacent to each other in the row direction along the bit lines, said sense amplifiers including a first sense amplifier connected to two of said bit lines of one of said bit line groups in a folded bit-line scheme and a second sense amplifier arranged adjacent to said first sense amplifier and connected between said one of said bit line groups and the other which is neighboring thereto, in an open bit-line scheme;

a plurality of switching sections including a first switching circuit connected between said first sense amplifier and one of said bit line groups which is arranged between said first and second sense amplifiers and two second switching circuits, one of the two second switching circuits connected between said second sense amplifier and one of said adjacent two bit line groups and the other of the two second switching circuits connected between said second sense amplifier and the other of said adjacent two bit line groups, said first switching circuit including switching elements connected to the four bit lines of one of said bit line groups and driven to connect said first sense amplifier to the bit lines of said one of said bit line groups in the folded bit-line scheme, and each of said second switching circuits including switching elements connected to the two bit lines of one of said bit line groups and driven to connect the bit lines of said adjacent two bit line groups to said second sense amplifier in the open bit line scheme.

32. A semiconductor memory cell device comprising:

a substrate;

a plurality of word lines formed on said substrate;

a plurality of bit lines transverse to said word lines formed on said substrate; and an array of memory cells selectively arranged at a plurality of cross points defined between said word lines and said bit lines, every two of said memory cells being arranged respectively at two of every adjacent three of the cross points in each of row and column directions along the bit lines and word lines, said memory cells each being assembled by at least one capacitor and at least one MOS transistor, said capacitor being formed between a storage node and a plate electrode, and adjacent two storage nodes formed, using the same conductive layers, respectively on both sides of each of said word lines overlapping on a corresponding one of said word lines at each of said cross points;

wherein said memory cells each are assembled by a trench capacitor formed inside said substrate and at least one MOS transistor; and wherein said bit lines are divided into a plurality of bit line groups, and which includes:

a plurality of sense amplifiers each connected between two of said bit line groups which are adjacent to each other in the row direction along the bit lines, said sense amplifiers including a first sense amplifier connected to two of said bit lines of one of said bit line groups in a folded bit-line scheme and a second sense amplifier arranged adjacent to said first sense amplifier and connected between said one of said bit line groups and the other which is neighboring thereto, in an open bit-line scheme;

a plurality of switching sections including a first switching circuit connected between said first sense amplifier and one of said bit line groups which is arranged between said first and second sense amplifiers and two second switching circuits, one of the two second switching circuits connected between said second sense amplifier and one of said adjacent two bit line groups and the other of the two second switching circuits connected between said second sense amplifier and the other of said adjacent two bit line groups, said first switching circuit including switching elements connected to the four bit lines of one of said bit line groups and driven to connect said first sense amplifier to the bit lines of said one of said bit line groups in the folded bit-line scheme, and each of said second switching circuits including switching elements connected to the two bit lines of one of said bit line groups and driven to connect the bit lines of said adjacent two bit line groups to said second sense amplifier in the open bit line scheme.

33. A semiconductor memory cell device comprising:

a substrate;

a plurality of word lines formed on said substrate;

a plurality of bit lines transverse to said word lines formed on said substrate; and an array of memory cells selectively arranged at a plurality of cross points defined between said word lines and said bit lines, every two of said memory cells being arranged respectively at two of every adjacent three of the cross points in each of row and column directions along the bit lines and word lines, said memory cells each being assembled by at least one capacitor and at least one MOS transistor, said capacitor being formed between a storage node and a plate electrode, and adjacent two storage nodes formed, using the same conductive layers, respectively on both sides of each of said word lines overlapping on a corresponding one of said word lines at each of said cross points;

wherein said memory cells each are assembled by a trench capacitor formed inside said substrate and at least one MOS transistor; and wherein said bit lines are divided into a plurality of bit line groups, and which includes:

a plurality of sense amplifiers each connected between two of said bit line groups which are adjacent to each other in the row direction along the bit lines, said sense amplifiers including a first sense amplifier connected to two of said bit lines of one of said bit line groups in a folded bit-line scheme and a second sense amplifier arranged adjacent to said first sense amplifier and connected between said one of said bit line groups and the other which is neighboring thereto, in an open bit-line scheme;

a plurality of switching sections including a first switching circuit connected between said first sense amplifier and one of said bit line groups which is arranged between said first and second sense amplifiers and two second switching circuits, one of the two second switching circuits connected between said second sense amplifier and one of said adjacent two bit line groups and the other of the two second switching circuits connected between said second sense amplifier and the other of said adjacent two bit line groups, said first switching circuit including switching elements connected to the four bit lines of one of said bit line groups and driven to connect said first sense amplifier to the bit lines of said one of said bit line groups in the folded bit-line scheme, and each of said second switching circuits including switching elements connected to the two bit lines of one of said bit line groups and driven to connect the bit lines of said adjacent two bit line groups to said second sense amplifier in the open bit line scheme.

34. A semiconductor memory cell device comprising:

a substrate;

a plurality of word lines formed on said substrate;

a plurality of bit lines transverse to said word lines formed on said substrate; and an array of memory cells selectively arranged at a plurality of cross points defined between said word lines and said bit lines, every two of said memory cells being arranged respectively at two of every adjacent three of the cross points in each of row and column directions along the bit lines and word lines, said memory cells each being assembled by at least one capacitor and at least one MOS transistor, said capacitor being formed between a storage node and a plate electrode, and adjacent two storage nodes formed, using the same conductive layers, respectively on both sides of each of said word lines overlapping on a corresponding one of said word lines at each of said cross points;

wherein said memory cells each are assembled by a trench capacitor formed inside said substrate and at least one MOS transistor; and wherein said bit lines are divided into a plurality of bit line groups, and which includes:

a plurality of sense amplifiers each connected between two of said bit line groups which are adjacent to each other in the row direction along the bit lines, said sense amplifiers including a first sense amplifier connected to two of said bit lines of one of said bit line groups in a folded bit-line scheme and a second sense amplifier arranged adjacent to said first sense amplifier and connected between said one of said bit line groups and the other which is neighboring thereto, in an open bit-line scheme;

a plurality of switching sections including a first switching circuit connected between said first sense amplifier and one of said bit line groups which is arranged between said first and second sense amplifiers and two second switching circuits, one of the two second switching circuits connected between said second sense amplifier and one of said adjacent two bit line groups and the other of the two second switching circuits connected between said second sense amplifier and the other of said adjacent two bit line groups, said first switching circuit including switching elements connected to the four bit lines of one of said bit line groups and driven to connect said first sense amplifier to the bit lines of said one of said bit line groups in the folded bit-line scheme, and each of said second switching circuits including switching elements connected to the two bit lines of one of said bit line groups and driven to connect the bit lines of said adjacent two bit line groups to said second sense amplifier in the open bit line scheme.

\* \* \* \* \*